(12) United States Patent
Pothireddy et al.

(10) Patent No.: US 12,316,334 B2
(45) Date of Patent: May 27, 2025

(54) METHOD AND CIRCUIT FOR DLL LOCKING MECHANISM FOR WIDE RANGE HARMONIC DETECTION AND FALSE LOCK DETECTION

(71) Applicant: TEXAS INSTRUMENTS INCORPORATED, Dallas, TX (US)

(72) Inventors: Venkateswara Pothireddy, McKinney, TX (US); Bhavesh G. Bhakta, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 18/194,049

(22) Filed: Mar. 31, 2023

(65) Prior Publication Data

US 2024/0146315 A1 May 2, 2024

Related U.S. Application Data

(60) Provisional application No. 63/381,976, filed on Nov. 2, 2022.

(51) Int. Cl.
*H03L 7/095* (2006.01)
*H03L 7/081* (2006.01)
*H03L 7/089* (2006.01)
*H03L 7/091* (2006.01)

(52) U.S. Cl.
CPC ............ *H03L 7/095* (2013.01); *H03L 7/0812* (2013.01); *H03L 7/0891* (2013.01); *H03L 7/091* (2013.01)

(58) Field of Classification Search
CPC ... H03L 7/0812; H03L 7/0816; H03L 7/0891; H03L 7/091; H03L 7/095
See application file for complete search history.

(56) References Cited

U.S. PATENT DOCUMENTS

| | | | | |
|---|---|---|---|---|
| 7,015,725 B1* | 3/2006 | Yu | ............................ | H03L 7/095 327/12 |
| 7,233,182 B1* | 6/2007 | Savoj | ........................ | H03L 7/10 327/147 |
| 9,553,594 B1* | 1/2017 | Gupta | ...................... | H03L 7/091 |
| 2007/0057708 A1* | 3/2007 | Uehara | .................. | H03L 7/0812 327/156 |
| 2009/0167387 A1* | 7/2009 | Kim | ........................ | H03L 7/0812 327/158 |
| 2015/0214965 A1* | 7/2015 | Odedara | ................ | H03L 7/0816 327/158 |

* cited by examiner

*Primary Examiner* — Patrick O Neill
(74) *Attorney, Agent, or Firm* — Michelle F. Murray; Frank D. Cimino

(57) ABSTRACT

A circuit includes a phase detector configured to produce a first up signal and a first down signal based on a difference between a reference clock and a feedback clock and a harmonic detector coupled to the phase detector, the harmonic detector configured to produce a second up signal based on the first up signal and whether the harmonic detector detects a harmonic lock between the reference clock and the feedback clock based on a first clock phase and a second clock phase. Additionally, the circuit includes a false lock detector coupled to the phase detector and to the harmonic detector, the false lock detector configured to produce a second down signal based on the first down signal and whether the false lock detector detects a false lock between the reference clock and the feedback clock based on a third clock phase and a fourth clock phase.

20 Claims, 14 Drawing Sheets

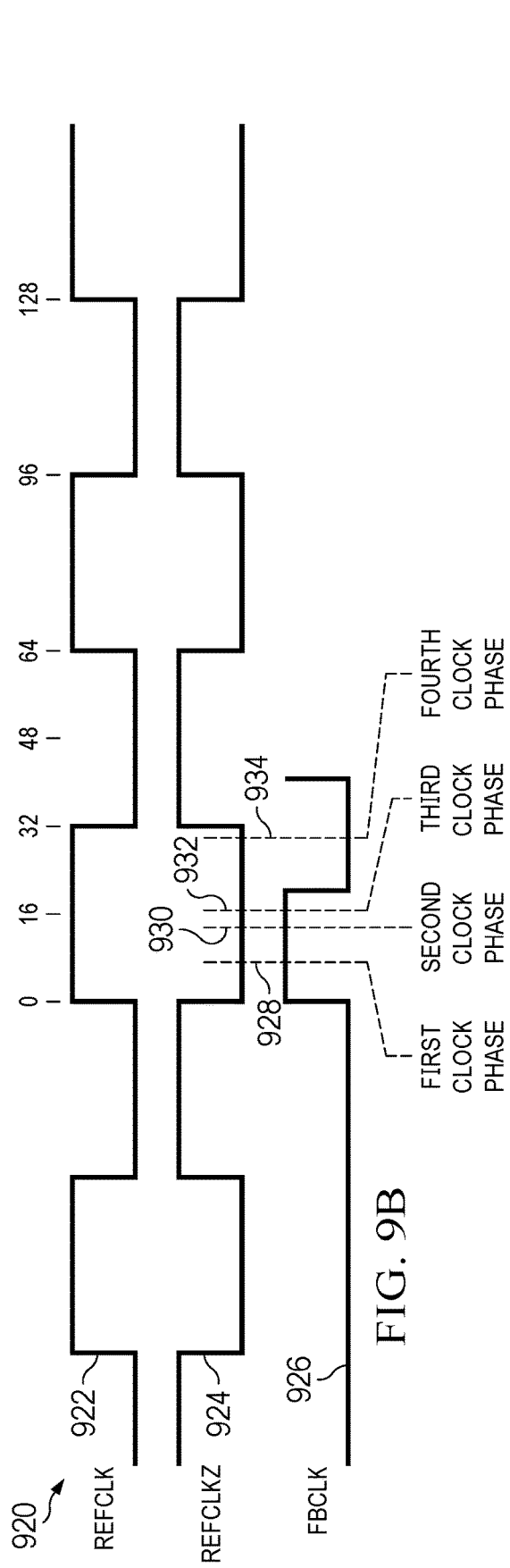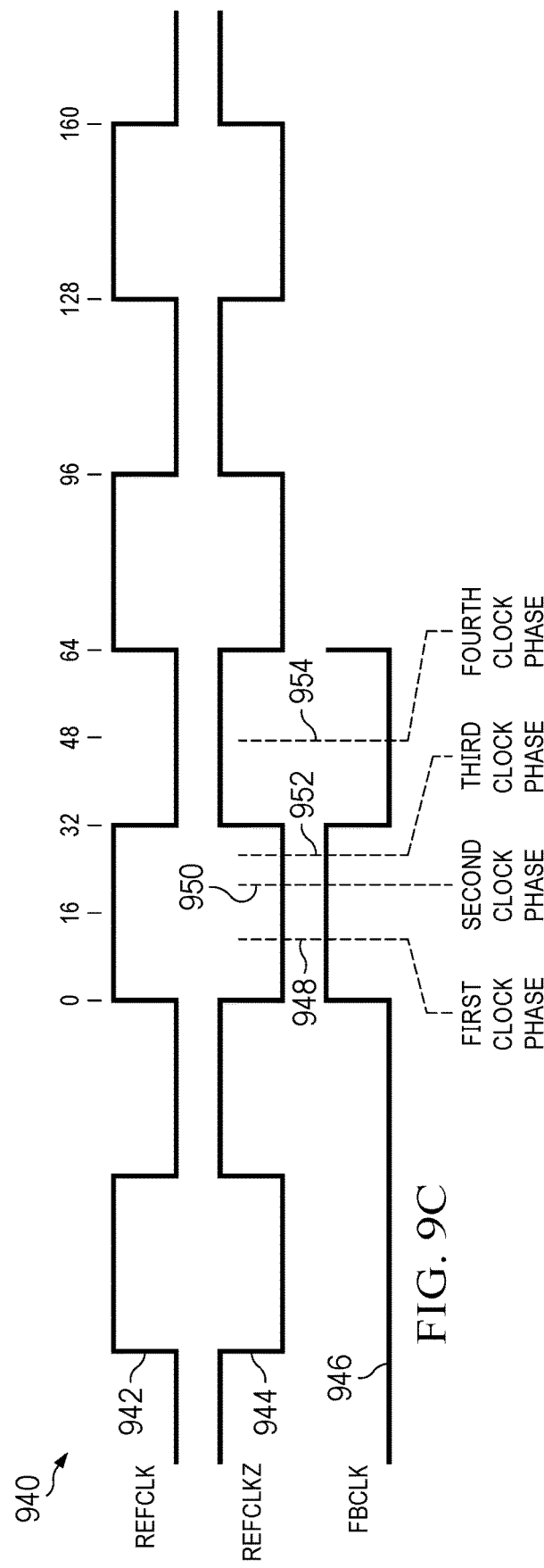

METHOD AND CIRCUIT FOR DLL LOCKING MECHANISM FOR WIDE RANGE HARMONIC DETECTION AND FALSE LOCK DETECTION

CROSS-REFERENCE TO RELATED APPLICATION

This application claims priority to U.S. Provisional Patent Application No. 63/381,976, filed on Nov. 2, 2022, and entitled "Method and Circuit for DLL Locking Mechanism for Wide Range Harmonic Detection and False Lock Detection," which application is hereby incorporated herein by reference in its entirety.

TECHNICAL FIELD

The present application relates in general to electronic circuitry, and, in particular, to a circuit, system, and method for delay-locked loop (DLL).

BACKGROUND

In many applications, for example applications that involve transmitting or receiving many signals, it is desirable to use a delay-locked loop (DLL) to synchronize the clocks of the signals. A DLL generates clock phases based on an input reference clock. The clock phases are may be used for data pipelining or adding precise delay in the data path. It is desirable for the DLL to be stable and properly locked to function properly.

SUMMARY

In an example, a circuit includes a phase detector configured to produce a first up signal and a first down signal based on a difference between a reference clock and a feedback clock and a harmonic detector coupled to the phase detector, the harmonic detector configured to produce a second up signal based on the first up signal and whether the harmonic detector detects a harmonic lock between the reference clock and the feedback clock based on a first clock phase and a second clock phase. Additionally, the circuit includes a false lock detector coupled to the phase detector and to the harmonic detector, the false lock detector configured to produce a second down signal based on the first down signal and whether the false lock detector detects a false lock between the reference clock and the feedback clock based on a third clock phase and a fourth clock phase.

In an example, a circuit includes a first flip flop having a first flip flop input, a second flip flop input, and a first flip flop output and a second flip flop having a third flip flop input, a fourth flip flop input, and a second flip flop output. The circuit also includes a first logic gate having a first logic input, a second logic input, and a first logic output, the first logic input coupled to the first flip flop output and the second logic input coupled to the second flip flop output and a third flip flop having a fifth flip flop input, a sixth flip flop input, and a third flip flop output, the fifth flip flop input coupled to an inverse of the first flip flop input. Additionally, the circuit includes a fourth flip flop having a seventh flip flop input, an eighth flip flop input, and a fourth flip flop output, the seventh flip flop input coupled to an inverse of the third flip flop input and a second logic gate having a third logic input, a fourth logic input, and a second logic output, the third logic input coupled to the third flip flop output and the fourth logic input coupled to the fourth flip flop output.

In an example, a system includes a data path and a delay-locked loop (DLL) coupled to the data path. The DLL includes a phase frequency detector (PFD) including a phase detector configured to produce an up signal and a first down signal based on a difference between a reference clock and a feedback clock and a false lock detector coupled to the phase detector, the false lock detector configured to produce a second down signal by detecting a false lock between the reference clock and the feedback clock based on the reference clock, a first clock phase, and a second clock phase. The DLL also includes a charge pump coupled to the PFD, the charge pump configured to produce a voltage control signal and a variable delay line coupled to the PFD and to the charge pump, where the variable delay line is configured to, based on the voltage control signal, produce clock phases including the first clock phase and the second clock phase.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 9A illustrates a table showing the operation of an example PFD with a harmonic detector and a false lock detector and FIGS. 9B-E illustrate graphs showing the operation of an example PFD with a harmonic detector and a false lock detector.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Although the example illustrative arrangements have been described in detail, it should be understood that various changes, substitutions and alterations can be made herein without departing from the spirit and scope of the present application as defined by the appended claims.

Examples in this disclosure perform false lock detection and/or harmonic lock detection for a delay-locked loop (DLL). An example false lock detector uses two flip flops and a logic gate for a simple, low cost, low power solution. An example harmonic detector uses two flip flops and a logic gate for a simple, low cost, low power solution. An example phase frequency detector of a DLL contains a phase detector coupled to a false lock detector and to a harmonic detector.

Figure 1A:
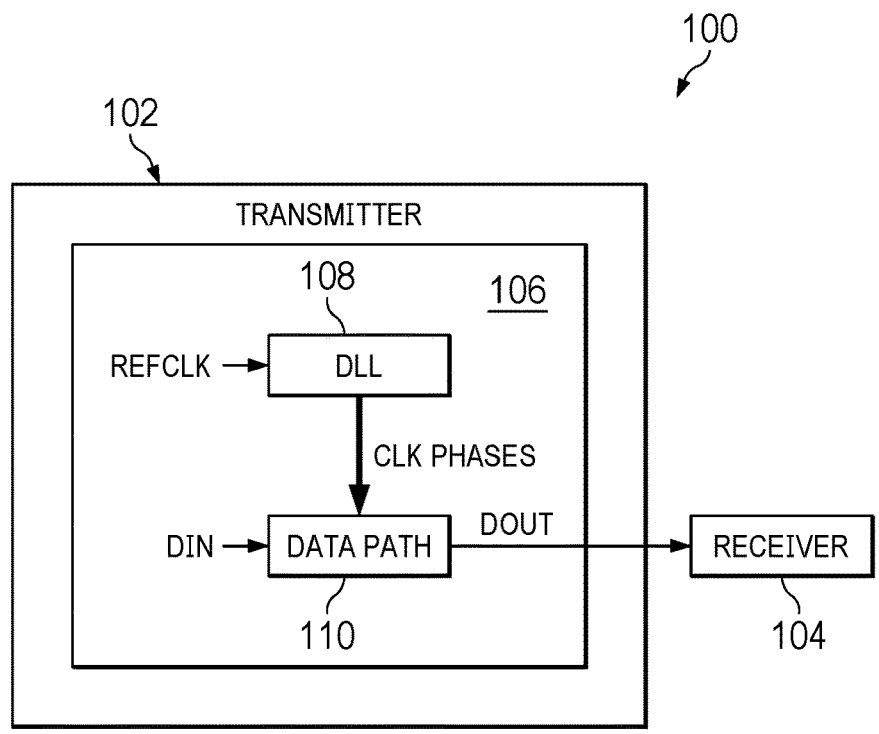
FIGS. 1A-C illustrates example systems including a delay-locked loop (DLL)
Figure 1B:
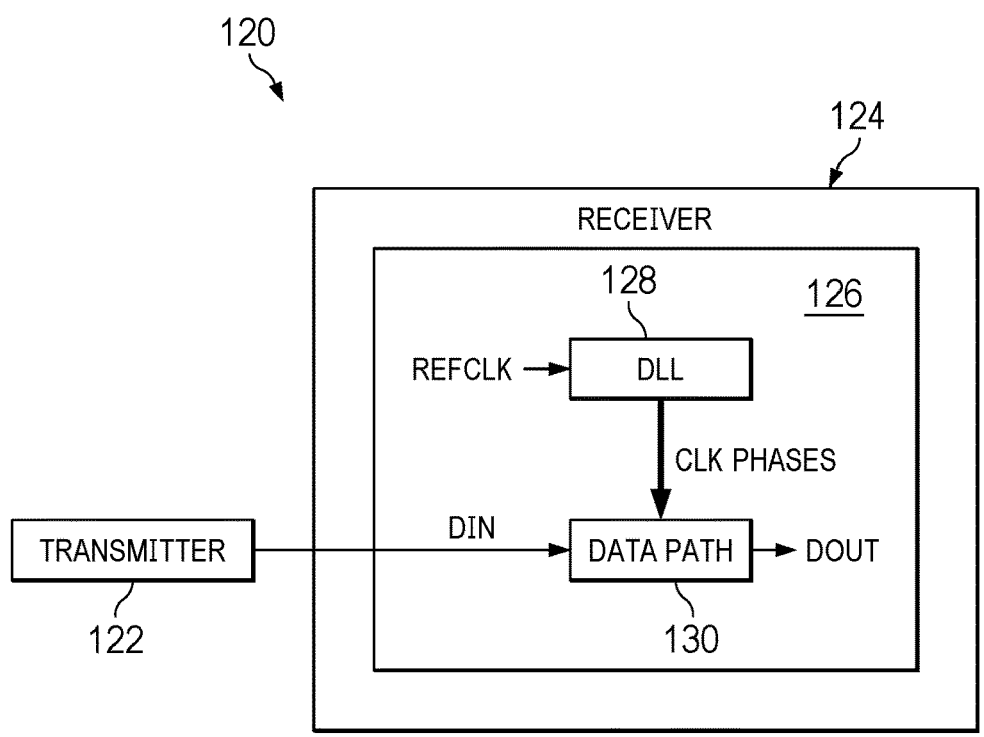
Figure 1C:
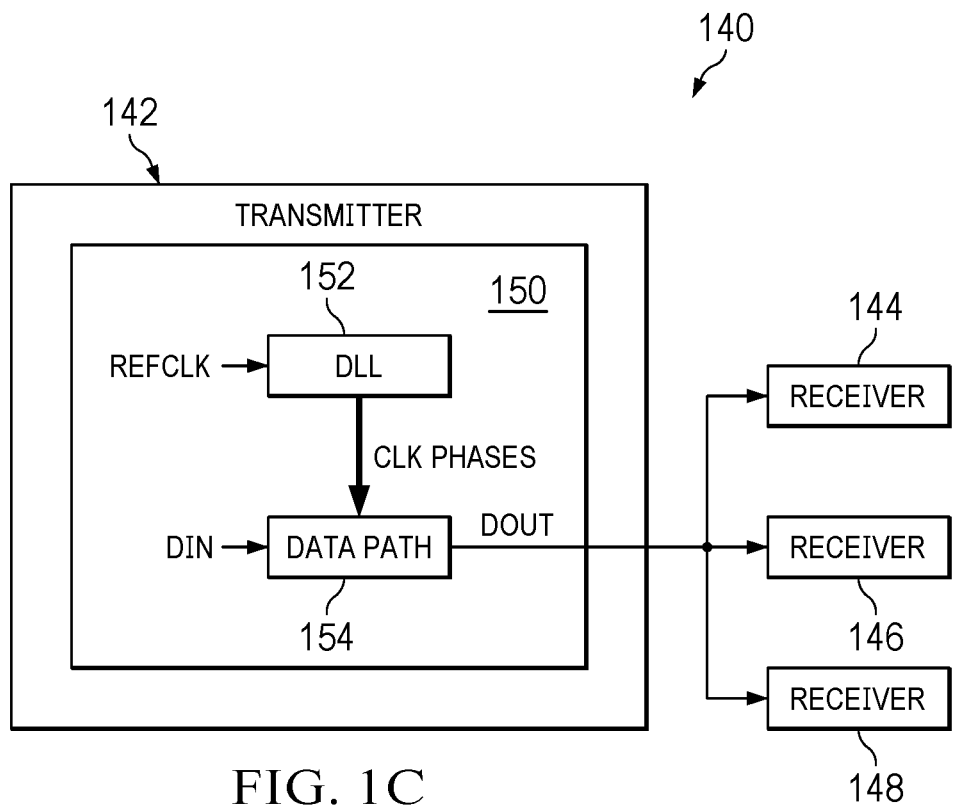

A DLL generates clock phases based on a reference clock. The clock phased may be used for data pipelining or adding precise delay in a data path. FIGS. 1A-C illustrates example systems including a delay-locked loop (DLL). FIG. 1A illustrates a system 100 with a transmitter 102 and a receiver 104. The transmitter 102 transmits data to the receiver 104. In an example, the receiver 104 is a spatial light modulator (SLM) that displays an image, and the transmitter 102 may be a controller which sends data and control signals to the SLM. The SLM may be a digital micromirror device (DMD), a liquid crystal on silicon (LCOS) device, or a liquid crystal display (LCD). System 100 may be another type of system that contains a transmitter 102 and a receiver 104, for example a high speed data channel. In an example the transmitter 102 is a processor and the receiver 104 is a memory interface. In another example, the transmitter 102 is a memory interface and the receiver 104 is a processor. In an additional example, the transmitter 102 is a camera and the receiver 104 is a processor or a display interface. The transmitter 102 contains a DLL subsystem 106. The DLL subsystem contains a DLL 108 coupled to a data path 110. The DLL 108 receives a reference clock (REFCLK) and produces clock (CLK) phases based on the reference clock. The clock phases are evenly spaced within a period of the reference clock. The DLL 108 may produce any number of clock phases, for example 64 clock phases. In other examples, DLL 108 produces a different number of clock phases, for example 32 clock phases or 128 clock phases. The data path 110 receives input data (DIN) for transmission, and receives the clock phases from the DLL 108. The data path 110 aligns the signals of the input data, using the clock phases, to produce output data (DOUT). The output data is transmitted to the receiver 104. In an example the output data is transmitted over a high speed serial interface (HSSI).

FIG. 1B illustrates a system 120 containing a transmitter 122 coupled to a receiver 124. The transmitter 122 transmits data to the receiver 124. In an example, the receiver 124 is an SLM, and the transmitter 122 is a controller. In an example the transmitter 122 is a processor and the receiver 124 is a memory interface. In another example, the transmitter 122 is a memory interface and the receiver 124 is a processor. In an additional example, the transmitter 122 is a camera and the receiver 124 is a processor or a display interface. The receiver 124 contains a DLL subsystem 126. The DLL subsystem 126 contains a DLL 128 coupled to a data path 130. The data path 130 receives input data from the transmitter 122. The DLL 128 receives a reference clock and produces clock phases based on the reference clock. The DLL 128 may produce any number of clock phases, for example 64 clock phases. In other examples, DLL 128 produces a different number of clock phases, for example 32 clock phases or 128 clock phases. The data path 130 uses the clock phases from the DLL 128 to align the clocks of the input data, to produce output data. In an example, the input data is transmitted over an HSSI.

FIG. 1C illustrates a system 140 containing a transmitter 142 which sends data to receiver 144, receiver 146, and receiver 148. In an example, the receiver 144, the receiver 146, and the receiver 148 are printed circuit boards (PCBs). In another example, the transmitter 142 is a video transmitter and the receiver 144, the receiver 146, and the receiver 148 are video receivers. In some examples, the system 140 is a buffer tree or a clock distribution network. System 140 illustrates 3 receivers, but other examples may have a different number of receivers, including many more receivers. The transmitter 142 contains a DLL subsystem 150. The DLL subsystem 150 contains a DLL 152 coupled to a data path 154. The DLL 152 receives a reference clock and produces clock phases based on the reference clock. In an example, the DLL 152 produces 64 clock phases. In other examples, the DLL 152 produces a different number of clock phases, for example 32 clock phases or 128 clock phases. The data path 154 receives input data and aligns the input data using the clock phases from the DLL 152, to produce output data.

Figure 2:
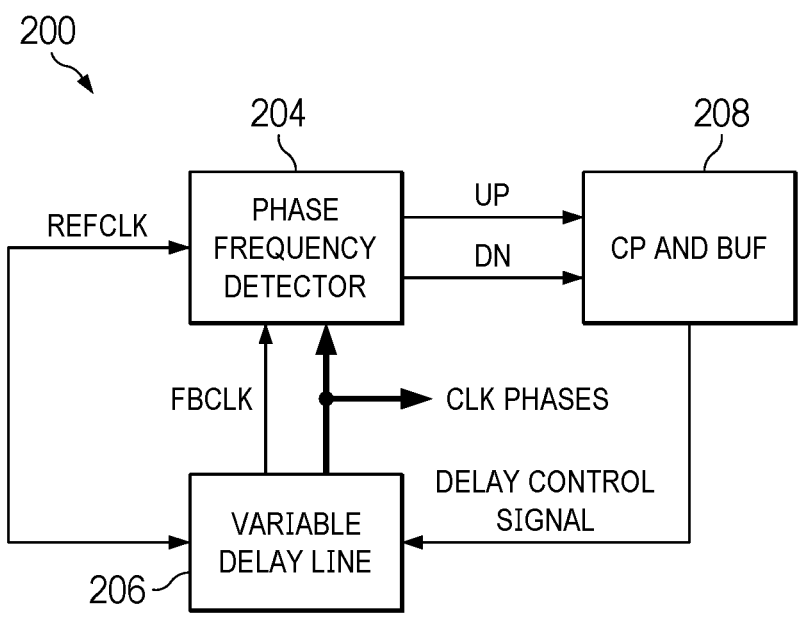
FIG. 2 illustrates an example DLL.

FIG. 2 illustrates an example DLL 200. The DLL 200 may be an example of the DLL 108 illustrated in FIG. 1A, the DLL 128 illustrated in FIG. 1B, or the DLL 152 illustrated in FIG. 1C. The DLL 200 receives an input of a reference clock (RFCLK) and produces an output of clock (CLK) phases. The reference clock is a high quality, low jitter system clock. The DLL 200 contains a phase frequency detector (PFD) 204 coupled to a variable delay line 206 and a charge pump (CP) and buffer (BUF) 208. The PFD 204 receives the reference clock, and receives a feedback clock (FBCLK) and clock phases from the variable delay line 206. The PFD 204 produces an UP signal and a down (DN) signal based on the phase difference between the reference clock and the feedback clock for harmonic lock detection and false lock detection. In some examples, the PFD 204 also uses the clock phases for harmonic lock detection and false lock detection. The PFD 204 transmits the UP signal and the DN signal to the CP and buffer 208. The UP signal and the DN signal adjust the voltage of the charge pump. The CP and buffer 208 produces a delay control signal based on the UP signal and the DN signal, and transmits the voltage control signal to the variable delay line 206. In one example, the variable delay line is a voltage controlled delay line (VCDL) and the delay control signal is a voltage control signal (VCTRL). In another example, the variable delay line is a current controlled delay line (CCDL) and the delay control signal is a current control signal (CCTRL). The UP signal increases the voltage control signal output by the CP and buffer 208 and the DN signal decreases the delay control signal output by the CP and buffer. In an example in which the variable delay line is a VCDL and the delay control signal is a VCTRL, the VCTRL is the supply voltage for the delay elements of the VCDL. In an example in which the variable delay line is a CCDL and the delay control signal is a CCTRL, the CCTRL produces current to control the delay of delay elements of the CCDL. The variable delay line 206 produces the feedback clock and the clock phases based on the voltage control signal and the reference clock. The variable delay line 206 produces the clock phases by delaying the reference clock by fixed delays. The variable delay line 206 also produces the feedback clock by delaying the reference clock by a full period. In an example in which the variable delay line 206 is a VCDL, a higher voltage control signal decreases the delay of the VCDL and a lower voltage control signal increases the delay of the VCDL. In an example in which the variable delay line 206 is a CCDL, a higher current control signal decreases the delay of the CCDL and a lower current control signal increases the delay of the CCDL.

To function properly, the DLL 200 should be stable and locked. When the DLL 200 is locked, the delay of the feedback clock equals the time period of the reference clock. The DLL 200 may experience false lock, in which the DLL 200 moves in the direction towards zero delay and fails to lock. The DLL 200 may experience harmonic lock, where the period of the feedback clock is an integer number of multiples of the period of the reference clock. Embodiments of the present description detect and correct false lock in the DLL 200. Some embodiments of the present description detect and correct harmonic lock up to five times. Other embodiments of the present description with additional logic detect and correct harmonic of greater than five times. Embodiments provide a digital, low power, low cost method of detecting and correcting false locks and harmonic locks.

Figure 3:
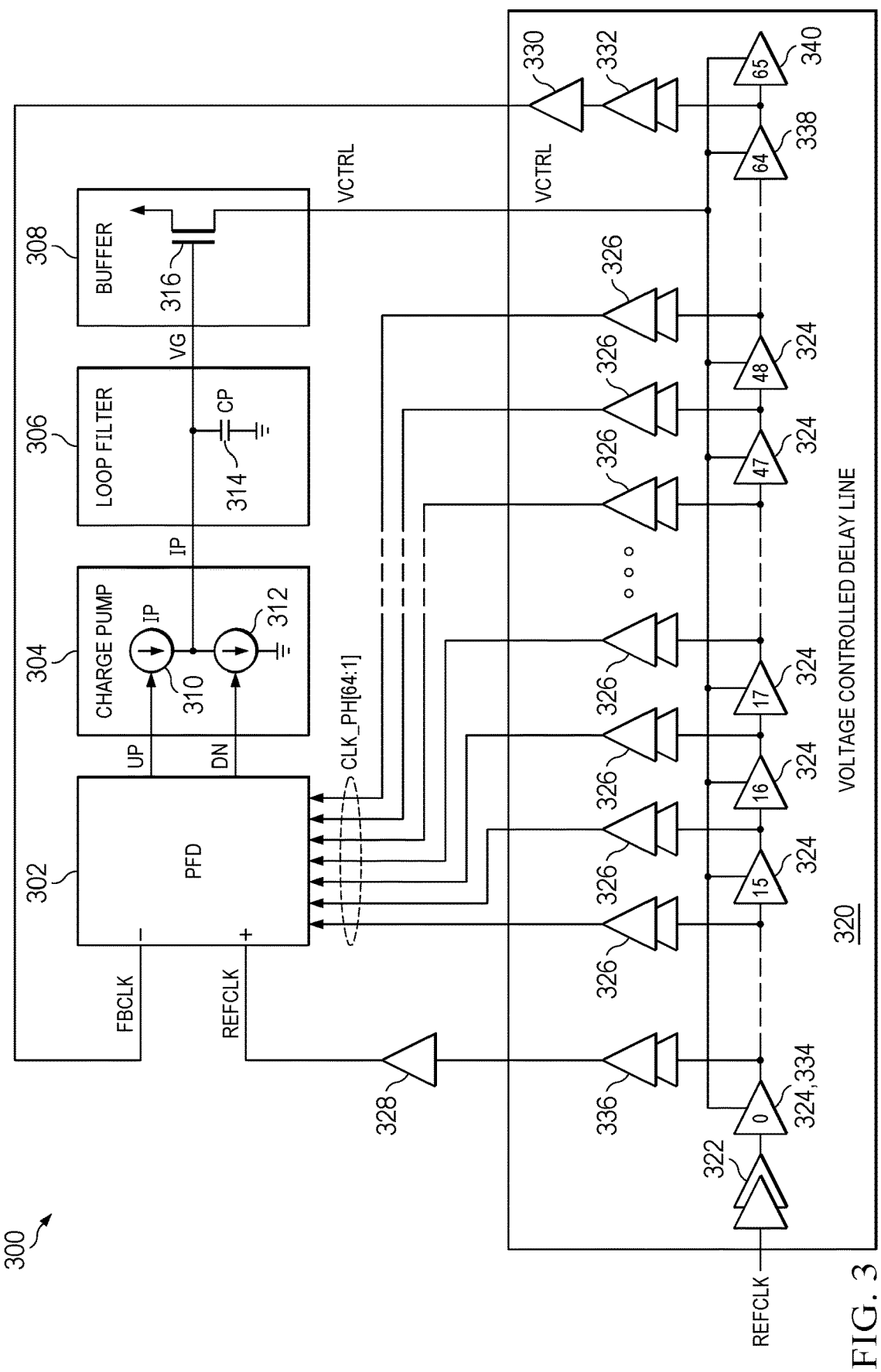
FIG. 3 illustrates another example DLL.

FIG. 3 illustrates a DLL 300, which may be an example of the DLL 200 illustrated in FIG. 2, the DLL 108 illustrated in FIG. 1A, the DLL 128 illustrated in FIG. 1B, or the DLL 152 illustrated in FIG. 1C. The DLL 300 contains a PFD 302, a charge pump 304, a loop filter 306, a buffer 308, a VCDL 350, buffer a 328, buffers 326, a buffer 322, a buffer 332, and a buffer 330. In an example, the DLL 300 contains three voltage domains. The charge pump 304, the loop filter 306, and the buffer 308 are in a first fixed voltage domain, the PFD 302, the buffer 328, the buffer 330, and a portion of the VCDL are in a second fixed voltage domain, and a portion of the VCDL 350 is in a variable voltage domain. The DLL 300 has an input to receive the reference clock (REFCLK) and an output to produce the clock phases (CLK_PH[64:1]). The PFD 302 receives the feedback clock (FBCLK) at a first input terminal and receives a reference clock at a second input terminal. The PFD 302 also receives the clock phases as inputs. The PFD 302 has outputs of an UP signal and a DN signal. The PFD 302 produces the UP signal and the DN signal based on the phase difference between the feedback clock and the reference clock, based on harmonic lock detection using the reference clock and the clock phases, and based on false lock detection using the reference clock and the clock phases. The DLL 300 contains 64 phases, but a different number of phases may be used, for example 32 phases or 128 phases. The PFD 302 produces an UP signal when the feedback clock is delayed too much and produces a DN signal when the feedback clock is delayed too little.

The charge pump 304 is coupled to the PFD 302 and to the loop filter 306. The charge pump 304 receives the UP signal and the DN signal from the PFD 302. The charge pump 304 contains a variable current source 310 and a variable current source 312. In some embodiments, a different charge pump 304 may be used. The charge pump 304 produces a pump current ($I_P$) at a terminal between the variable current source 310 and the variable current source 312. The UP signal increases the current from the variable current source 310 to increase the current of the pump current, while the DN signal decreases the current from the variable current source 312 to reduce the current of the pump current.

The loop filter 306 is coupled to the charge pump 304 and to the buffer 308. The loop filter 306 filters the pump current to produce a voltage (V g). The loop filter 306 contains a capacitor CP 314. One terminal of the capacitor 314 is coupled to ground and the other terminal of the capacitor 314 is coupled between the variable current source 310 and the variable current source 312.

The buffer 308 is coupled to the loop filter 306 and to the VCDL 320. The buffer 308 buffers the gate voltage to produce a control voltage (VCTRL). In some examples, the buffer 308 is not used. The buffer 308 contains transistor 316. The transistor 316 has a gate coupled to the loop filter, a source coupled to a supply voltage, and a drain coupled to the VCDL 320. The gate of the transistor 316 receives the gate voltage. The buffer 308 produces the control voltage VCTRL at the drain of the transistor 316.

The VCDL 320 is coupled to the buffer 308 and to the PFD 302 via the buffer 328, the buffer 330, the buffer 332, and the buffers 326. In an example, the VCDL 320 is an example of the variable delay line 206 illustrated in FIG. 2. The VCDL 320 contains delay elements 324, a delay element 338, and a delay element 340 in a variable voltage domain. The VCDL 320 also contains buffers 326, a buffer 322, a buffer 336, and a buffer 332 in a fixed voltage domain. The VCDL 320 receives a reference clock via a buffer 322 and the VCTRL, and produces the reference clock via the buffer 336 and the buffer 328, the clock phases (CLK_PH[64:1]) via the buffers 326 and a feedback clock (FBCLK) via the buffer 332 and the buffer 330. The VCDL 320 receives the reference clock via the buffer 322. The VCDL 320 contains N delay elements 324 coupled in series, where N is a positive integer. In the illustrated example, N is 66, but N may be another number, for example 34 or 130. The delay elements 324 have a delay that is based on the voltage control signal. A higher voltage control signal reduces the delay time, and a lower voltage control signal increases the delay time. The output of the first delay element 334 of delay elements 324 passes through a first delay element 334 of delay elements 324, the buffer 336, the buffer 328 to an input of the PFD 302 as the reference clock. The outputs of the delay elements from the second delay element of the delay elements 324 to the N−2th delay element of the delay element 324, are coupled to inputs of the PFD 302 via the buffers 326. These outputs also provide the clock phase output of the DLL 300. The output of a delay element 338 of the delay elements 324 is coupled to an input of the PFD 302 via the buffer 332 and the buffer 330 as the feedback clock. The delay element 340 balances the loading among the delay elements 324 and the delay element 338.

Figure 4:
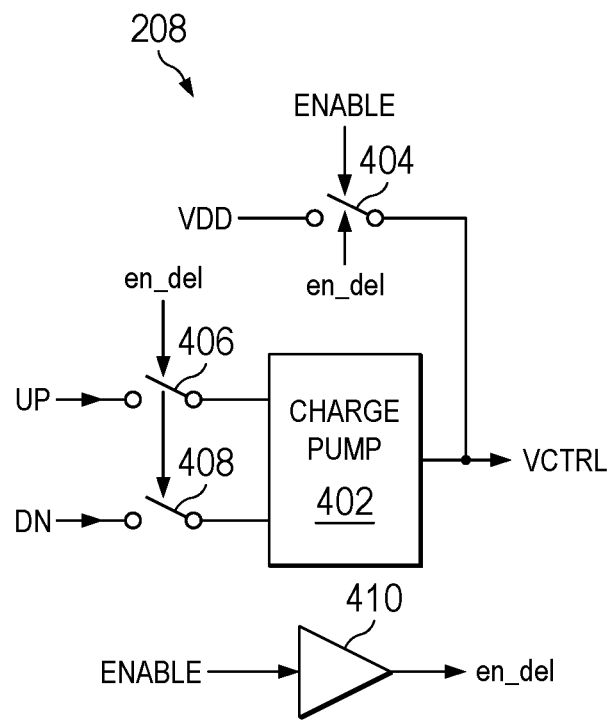
FIG. 4 illustrates an example charge pump (CP) and buffer.

FIG. 4 illustrates a charge pump and buffer 208 containing charge pump (CP) 402 and a buffer 410. The charge pump and buffer 208 also includes a switch 404, a switch 406, and a switch 408. The charge pump and buffer 208 illustrated in FIG. 4 is an initial conditioning circuit operating in open loop to produce a known voltage control signal during start up until the modules are stable. The buffer 410 receives an enable signal at an input and delays the enable signal to produce an enable delay (en_del) signal at an output. The output of the buffer 410 is coupled to control terminals of the switch 406 and the switch 408. The enable delay signal places the switch 406 and the switch 408 in an open position, disconnecting the inputs of the charge pump from the UP and DN signals. The enable and enable delay signals are coupled to control inputs of the switch 404. The enable and enable delay signals close the switch 404, causing the voltage control signal to be $V_{DD}$. When modules are sufficiently stable, the charge pump and buffer 208 transition from operating in open loop to operating in closed loop. The switch 406 and the switch 408 are closed, enabling the inputs of the charge pump 402 to receive the UP signal and the DN signal. Also, the switch 404 is opened, so the voltage control signal is the output of the charge pump 402.

Figure 5:
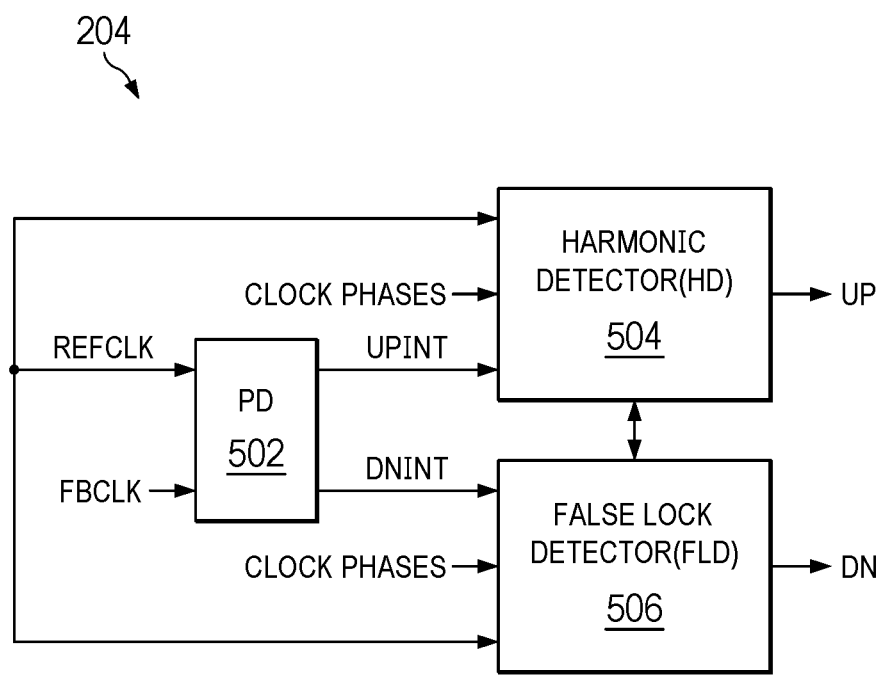
FIG. 5 illustrates an example phase frequency detector (PFD)

FIG. 5 illustrates an example phase frequency detector (PFD) 204. The PFD 204 contains a phase detector (PD) 502 coupled to a harmonic detector (HD) 504 and to a false lock detector (FLD) 506. The harmonic detector 504 and the false lock detector 506 communicate to determine which of the harmonic detector 504 and the false lock detector 506 takes priority when the harmonic detector 504 detects a harmonic lock and the false lock detector 506 detects a false lock. In one example, the harmonic lock detector 504 has priority over the false lock detector 506. In another example, the false lock detector 506 has priority over the harmonic detector 504. The PD 502 produces an up signal (UPINT) and a down signal (DNINT) based on receiving a reference clock and a feedback clock. The PD 502 determines a phase difference between the reference clock and the feedback clock. The UPINT signal increases the voltage to the variable delay line 206, decreasing the delay, when the feedback clock is past the reference clock. The DNINT signal decreases the voltage to the variable delay line 206, increasing the delay, when the feedback clock is before the reference clock.

The harmonic detector 504 detects a harmonic lock based on clock phases and produces an UP signal based on the clock phases, the reference signal, and the UPINT signal to correct any detected harmonic lock. The harmonic detector 504 compares the reference clock to a first clock phase of the clock phases and a second clock phase of the clock signal, to detect a harmonic lock. When the harmonic detector 504 detects a harmonic lock, the harmonic detector 504 produces an UP signal of 1 to correct the harmonic lock. The harmonic detector 504 also transmits a harmonic lock signal to the false lock detector, indicating whether a harmonic lock has been detected. When the harmonic detector 504 does not detect a harmonic lock, the harmonic detector 504 produces an UP signal that is equal to the UPINT signal, enabling the PD 502 to control the UP signal.

The false lock detector 506 detects a false lock based on the clock phases, and produces a DN signal based on the clock phases, the reference clock, the harmonic lock signal, and the DNINT signal to correct any detected false lock. When the harmonic lock signal is applied, the false lock detector is deactivated. When the harmonic lock signal is not applied, the false lock detector 506 compares the reference clock to a third phase and a fourth phase of the clock phases, to detect a false lock. When the false lock detector 506 detects a false lock, the false lock detector 506 produces a DN signal having a 1 value, to correct the false lock. When the false lock detector 506 does not detect a false lock, the false lock detector 506 produces a DN signal that is equal to the DNINT signal, enabling the PD 502 to control the DN signal.

Figure 6A:
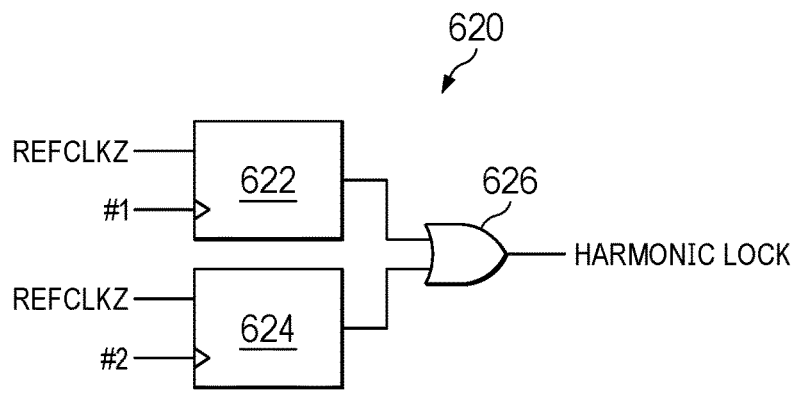
FIG. 6A illustrates an example harmonic detector.
Figure 6B:
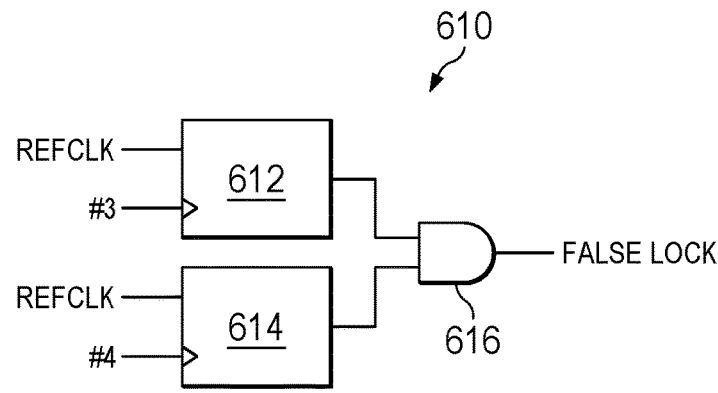
FIG. 6B illustrates an example false lock detector.
Figure 6C:
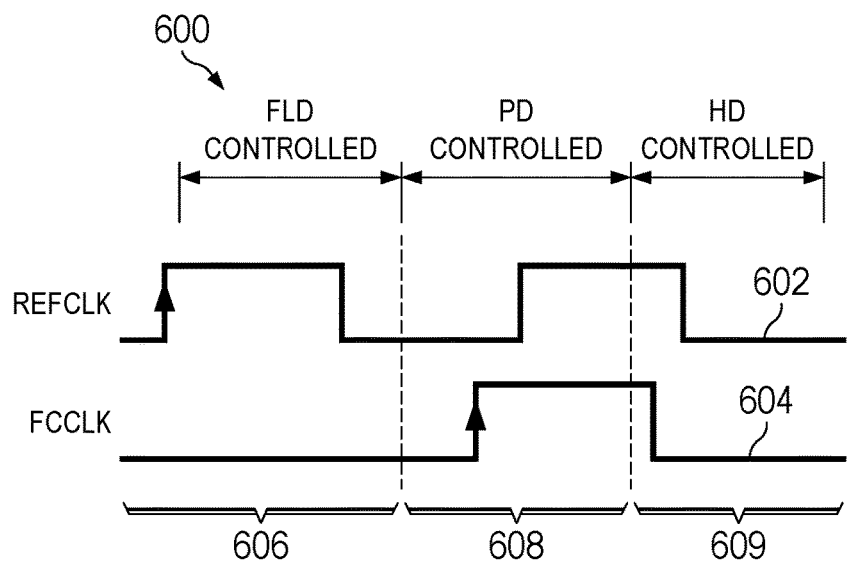
FIGS. 6C-F illustrate the operation of an example PFD with a harmonic detector and a false lock detector.
Figure 6D:
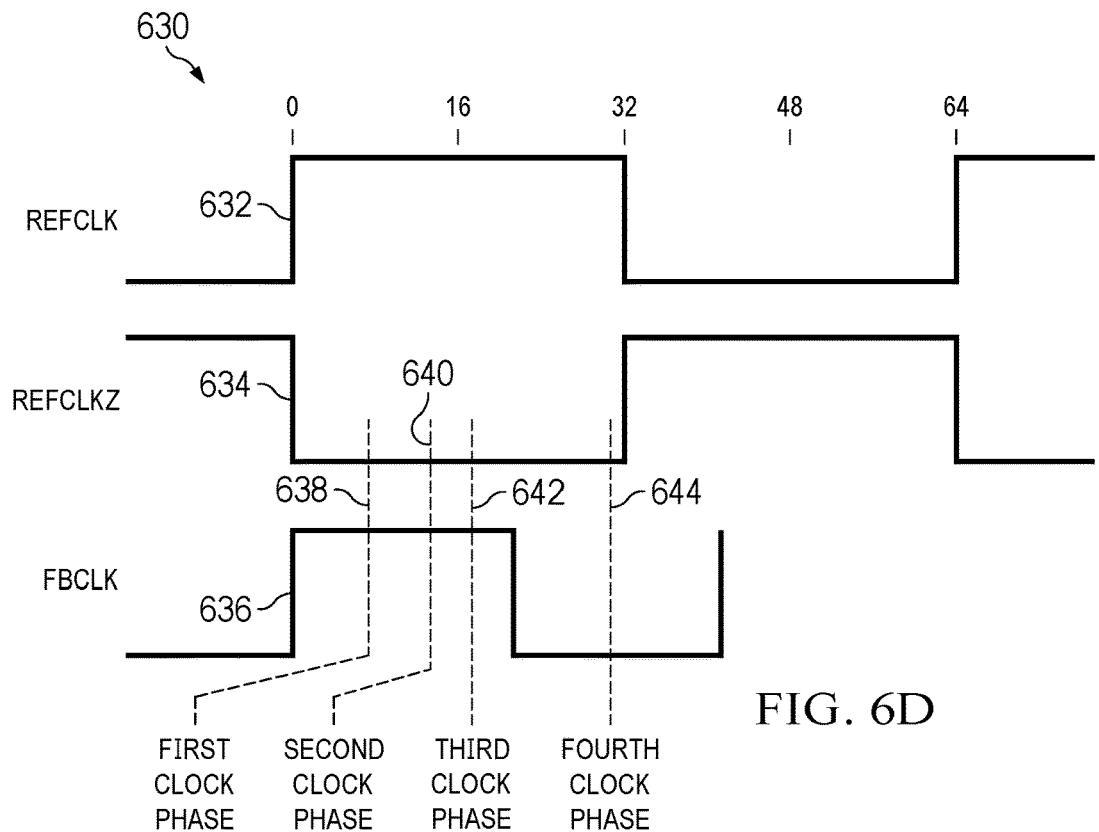
Figure 6E:
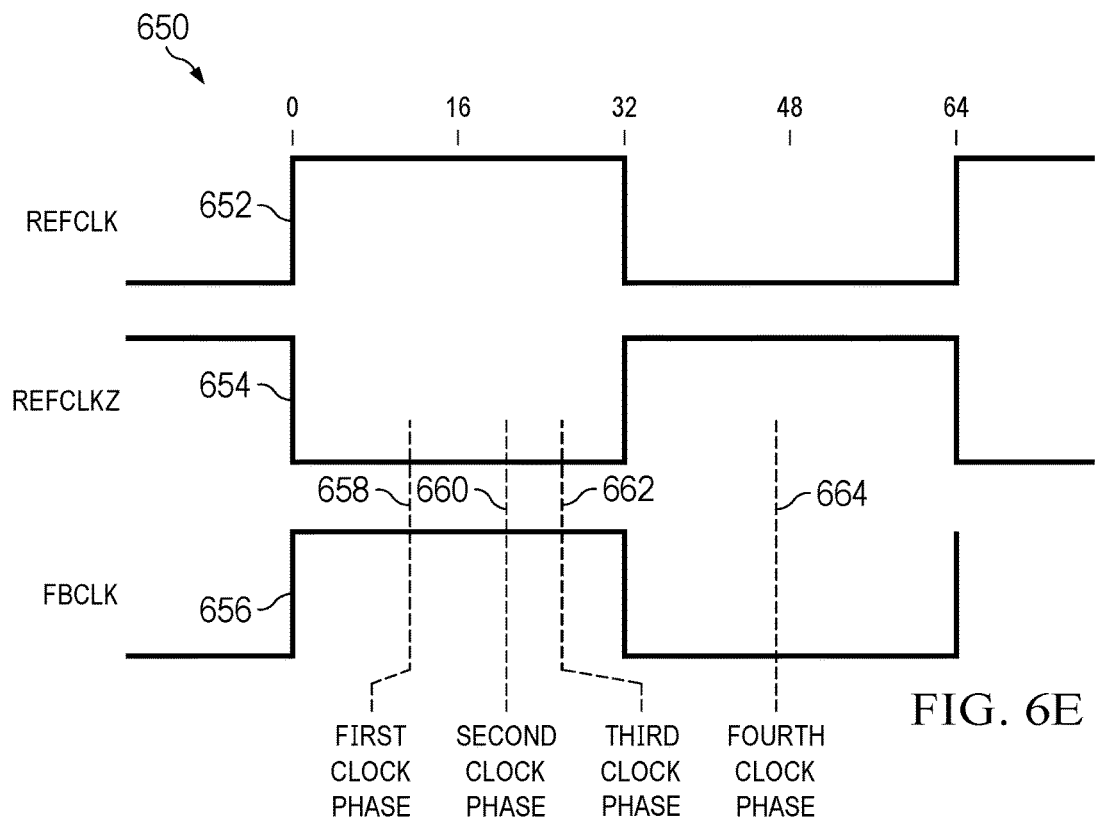
Figure 6F:
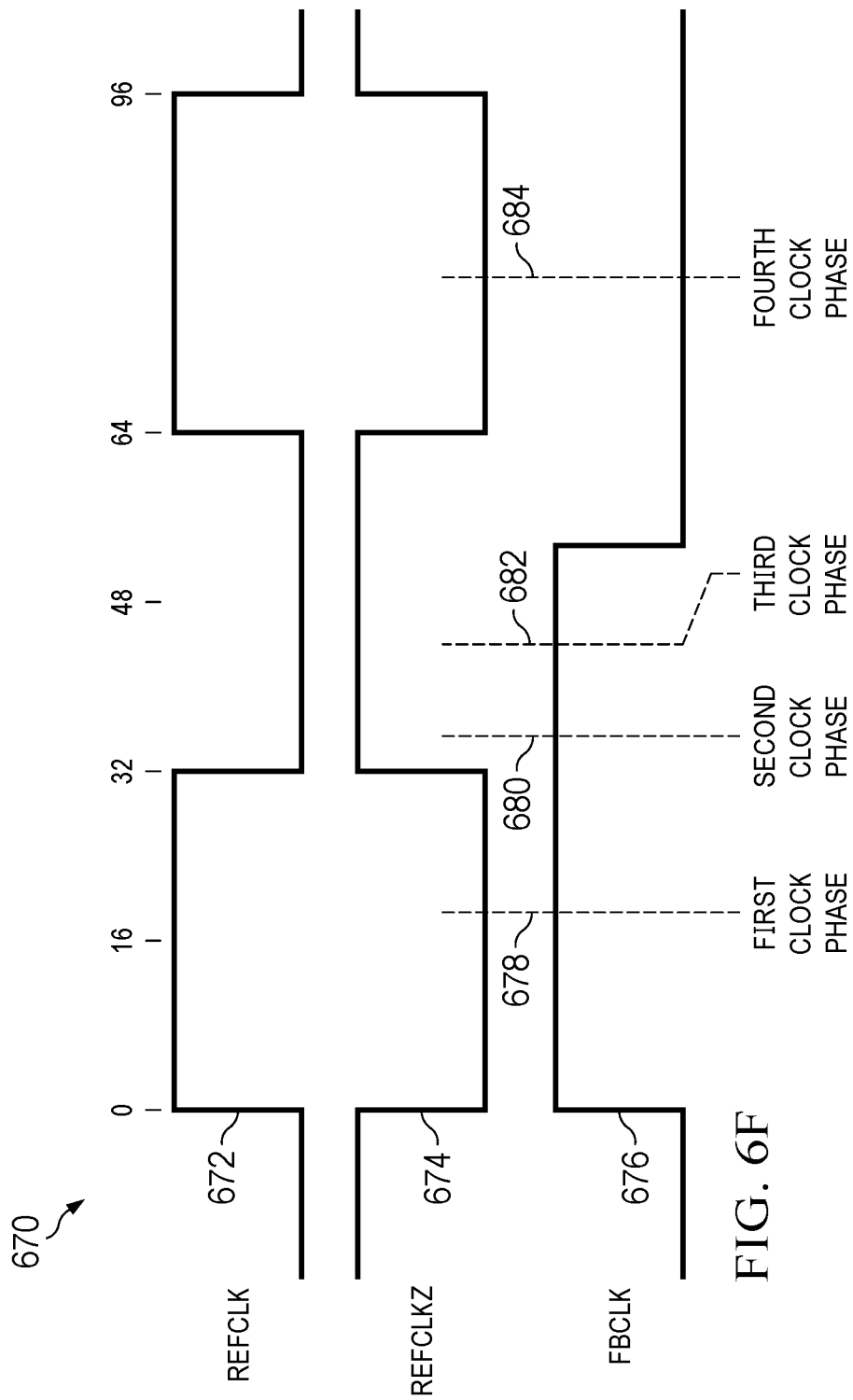

FIGS. 6A-F illustrate the operation of an example PFD. FIG. 6A illustrates an example harmonic detector 620, FIG. 6B illustrates an example false lock detector 610, FIG. 6C illustrates example graph 600 of a reference clock and a feedback clock, FIG. 6D illustrates an example graph 630 of positions of a reference clock, an inverse reference clock, a feedback clock, and clock phases, FIG. 6E illustrates an example graph 650 of positions of a reference clock, an inverse reference clock, a feedback clock, and clock phases, and FIG. 6F illustrates an example graph 670 of positions of a reference clock, an inverse reference clock a feedback clock, and clock phases.

FIG. 6A illustrates an example harmonic detector 620 containing a logic gate 626 coupled to a flip flop 622 and a flip flop 624. The harmonic detector 620 may be an example of at least a portion of the harmonic detector 504 illustrated in FIG. 5. In the harmonic detector 620, the logic gate 626 is an OR gate. The harmonic detector 620 contains two flip flops (flip flop 622 and flip flop 624) and a logic gate (logic gate 626), making it digital, low cost, and low power. The flip flop 622 has a first input terminal configured to receive an inverse reference clock (REFCLKZ), a second input terminal configured to receive a first clock phase of the clock phases, and an output terminal coupled to a first input terminal of the logic gate 626. The flip flop 622 is configured to sample the inverse reference clock at the first clock phase. The flip flop 624 has a first input terminal configured to receive the inverse reference clock, a second input terminal configured to receive a second clock phase of the clock phases, and an output terminal coupled to a second input terminal of the logic gate 626. The flip flop 624 is configured to sample the inverse reference clock at the second clock phase. The logic gate 626 has a first input terminal coupled to the output terminal of the flip flop 622, a second input terminal coupled to the output terminal of the flip flop 624, and an output terminal. The logic gate 626 is configured to produce a harmonic lock signal at the output terminal based on the output of the flip flop 622 and the output of the flip flop 624. The logic gate 626 will output a value of 1 when the inverse reference clock has a value of 1 at either the first clock phase or the second clock phase. That is, the logic gate 626 will output a value of 1, detecting a harmonic lock, when the reference clock has a value of 0 at either the first clock phase or the second clock phase. The logic gate 626 will output a value of 0, indicating that a harmonic lock is not detected, when the reference clock has a value of 1, and the inverse reference clock has a value of 0, at both the first clock phase and the second clock phase.

FIG. 6B illustrates an example false lock detector 610 containing a logic gate 616 coupled to a flip flop 612 and to a flip flop 614. The false lock detector 610 may be an example of at least a portion of the false lock detector 506 illustrated in FIG. 5. In the false lock detector 610, the logic gate 616 is an AND gate. The false lock detector 610 contains two flip flops (flip flop 612 and flip flop 614) and a logic gate (logic gate 616) making it digital, low cost, and low power. The flip flop 612 has a first input terminal configured to receive a reference clock, a second input terminal configured to receive a third clock phase of the clock phases, and an output terminal coupled to the logic gate 616. The flip flop 612 is configured to sample the reference clock at the third clock phase. The flip flop 614 has a first input terminal configured to receive the reference clock, a second input terminal configured to receive a fourth clock phase of the clock phases, and an output terminal coupled to the logic gate 616. The flip flop 614 is configured to sample the reference clock at the fourth clock phase. In an example, the logic gate is an AND gate. The logic gate 616 has a first input terminal coupled to the output terminal of the flip flop 612, a second input terminal coupled to the flip flop 614, and an output terminal. The logic gate 616 is configured to produce a false lock signal at the output terminal bases on the output of the flip flop 612 and the output of the flip flop 614. The logic gate 616 produces a false lock signal having a value of 1 when the reference clock has a value of 1 at both the third clock phase and the fourth phase, indicating a harmonic lock. The logic gate 616 produces a false lock signal of 0, indicating that there is no false lock, when the reference clock has a value of 0 at either the third reference clock or the fourth reference clock.

FIG. 6C illustrates a graph 600 illustrated a reference clock 602 and a feedback clock 604. In region 606, the false lock detector 610 detects a false lock, and the false lock output of the false lock detector 506 controls the operation of the PFD 204. In region 608, the reference clock 602 and the feedback clock 604 are sufficiently close to being properly locked that the phase detector 502 controls the operation of the PFD 204. In region 609, the harmonic detector 620 detects a harmonic lock, and the harmonic lock output of the harmonic detector 620 controls the operation of the PFD 204.

FIG. 6D illustrates a graph 630 of the operation of the PFD 204 in a false lock state. The graph 630 illustrates a reference clock 632, an inverse reference clock 634, and a feedback clock 636. The graph 630 also illustrates a first clock phase 638, a second clock phase 640, a third clock phase 642, and a fourth clock phase 644. Particular values of the first clock phase 638, the second clock phase 640, the third clock phase 642, and the fourth clock phase 644 are illustrated in the graph 630, but different values of the first clock phase 638, the second clock phase 640, the third clock phase 642, and the fourth clock phase 644 may be used. The harmonic detector 620, based on the inverse reference clock 634, the feedback clock 636, the first clock phase 638, and the second clock phase 640 does not detect a harmonic lock. The output of the flip flop 622 is 0, the output of the flip flop 624 is 0, and the harmonic lock output is 0. However, the false lock detector 610, based on the reference clock 632 the third clock phase 642, and the fourth clock phase 644 detects a false lock. The output of the flip flop 612 is a 1, the output of the flip flop 614 is a 1, and the false lock output is a 1. The false lock detector 610 then generates a false lock signal to correct the false lock. The false lock detector 506 produces a down signal based on the value of 1 for the false lock signal to reduce the voltage of the charge pump and buffer 208 to increase the delay in the variable delay line 206 to move the feedback clock 636 to better match the reference clock 632.

FIG. 6E illustrates a graph 650 depicting the operation of the PFD 204 in a properly locked state. The graph 650 illustrates a reference clock 652, an inverse reference clock 654, and a feedback clock 656. The graph 650 also illustrates a first clock phase 658, a second clock phase 660, a third clock phase 662, and a fourth clock phase 664. Particular values of the first clock phase 658, the second clock phase 660, the third clock phase 662, and the fourth clock phase 664 are illustrated in the graph 650, but different values of the first clock phase 658, the second clock phase 660, the third clock phase 662, and the fourth clock phase 664 may be used. The harmonic detector 620, based on the inverse reference clock 654, the first clock phase 658, and the second clock phase 660 does not detect a harmonic lock. The flip flop 622 produces a 0, the flip flop 624 produces a 0, and the harmonic lock signal is a 0. Also, the false lock detector 610, based on the reference clock 652, the third clock phase 662, and the fourth clock phase 664 does not detect a false lock. The flip flop 612 produces a 0, the flip flop 614 produces a 1, and the false lock signal is a 1. Accordingly, the PD 502 controls the operation of the PFD 204.

FIG. 6F illustrates a graph 670 of the PFD 204 in a harmonic lock state. The graph 670 illustrates a reference clock 672, an inverse reference clock 674, and a feedback clock 676. The graph 670 also illustrates a first clock phase 678, a second clock phase 680, a third clock phase 682, and a fourth clock phase 684. Particular values of the first clock phase 678, the second clock phase 680, the third clock phase 682, and the fourth clock phase 684 are illustrated in the graph 670, but different values of the first clock phase 678, the second clock phase 680, the third clock phase 682, and the fourth clock phase 684 may be used. The harmonic detector 620, based on the inverse reference clock 674, the first clock phase 678, and the second clock phase 680 detects a harmonic lock. The flip flop 622 produces a 0, the flip flop 624 produces a 1, and the harmonic lock signal is a 1. The harmonic detector 620 produces a harmonic lock signal that sets the UP signal to, to increase the voltage control signal produced by the charge pump and buffer 208, to increase the voltage or current of the variable delay line 206, and decrease the delay of the variable delay line 206. The false lock detector is deactivated based on the harmonic lock signal. The false lock detector 610, would have based on the reference clock 672, the feedback clock 676, the third clock phase 682, and the fourth clock phase 684, does not detect a false lock. The flip flop 612 would produce a 0, the flip flop 614 would produce a 1, and the false lock signal would be a 1.

Figure 7:
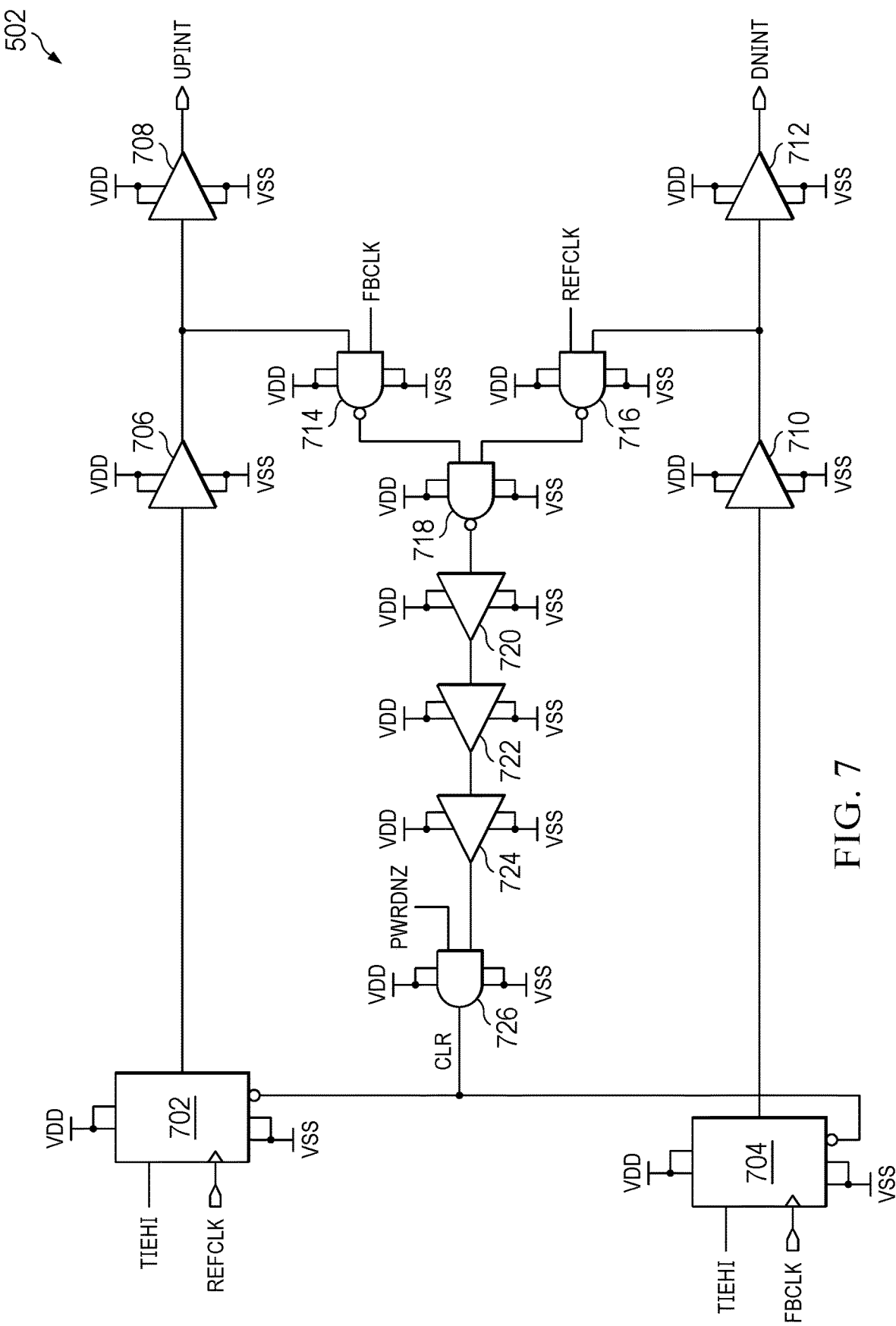
FIG. 7 illustrates an example phase detector (PD)

FIG. 7 illustrates an example phase detector (PD) 502. The phase detector 502 contains a flip flop 702, a flip flop 704, a buffer 706, a buffer 708, a buffer 710, a buffer 712, a logic gate 714, a logic gate 716, a logic gate 718, a logic gate 720, a buffer 722, a buffer 724, and a logic gate 726. The flip flop 702 has a first input terminal tied to high voltage, a second input terminal configured to receive the reference clock, a control terminal coupled to an output of the logic gate 726, and an output terminal coupled to an input terminal of the buffer 706. The buffer 706 has an input terminal coupled to the output terminal of the flip flop 702 and an output terminal coupled to the input terminal of the buffer 708 and to a first input terminal of the logic gate 714. The buffer 708 has an input terminal coupled to the output terminal of the buffer 706 and an output terminal. The buffer 708 is configured to produce an UPINT signal at the output terminal based on the output of the flip flop 702.

The flip flop 704 has a first input terminal tied to a high voltage, a second input terminal configured to receive the feedback clock, a control terminal coupled to an output of the logic gate 726, and an output terminal coupled to an input terminal of the buffer 710. The buffer 710 has an input terminal coupled to the output terminal of the flip flop 704 and an output terminal coupled to an input terminal of the buffer 712 and to a first input terminal of the logic gate 716. The buffer 712 has an input terminal coupled to the output terminal of the buffer 710, and an output terminal. The buffer 712 is configured to produce a DNINT signal at the output terminal based on the output of the flip flop 704.

In an example, the logic gate 714 is a NAND gate. The logic gate 714 has a first input terminal coupled to the output terminal of the buffer 706, a second input terminal configured to receive the feedback clock, and an output terminal coupled to a first input terminal of the logic gate 718. In an example, the logic gate 716 is a NAND gate. The logic gate 716 has a first input terminal coupled to the output terminal of the buffer 710, a second input terminal configured to receive the reference clock, and an output terminal coupled to a second input terminal of the logic gate 718. In an example, the logic gate 718 is a NAND gate. The logic gate 718 has a first input terminal coupled to the output terminal of the logic gate 714, a second input terminal coupled to the output terminal of the logic gate 716, and an output terminal coupled to an input terminal of the logic gate 720. In an example, the logic gate 720 is an inverter. The logic gate 720 has an input terminal coupled to the output terminal of the logic gate 718 and an output terminal coupled to an input terminal of the buffer 722. The buffer 722 has an input terminal coupled to the output terminal of the logic gate 720 and an output terminal coupled to an input terminal of the buffer 724. The buffer 724 has an input terminal coupled to the output terminal of the buffer 722 and an output terminal coupled to a second input terminal of the logic gate 726. In an example, the logic gate 726 is an AND gate. The logic gate 726 has a first input terminal configured to receive PWRDNZ, a second input terminal coupled to the output terminal of the buffer 724, and an output terminal coupled to the control terminal of the flip flop 702 and to the control terminal of the flip flop 704. PWRDNZ resents the phase detector 502 when the DLL 200 is disabled.

Figure 8A:
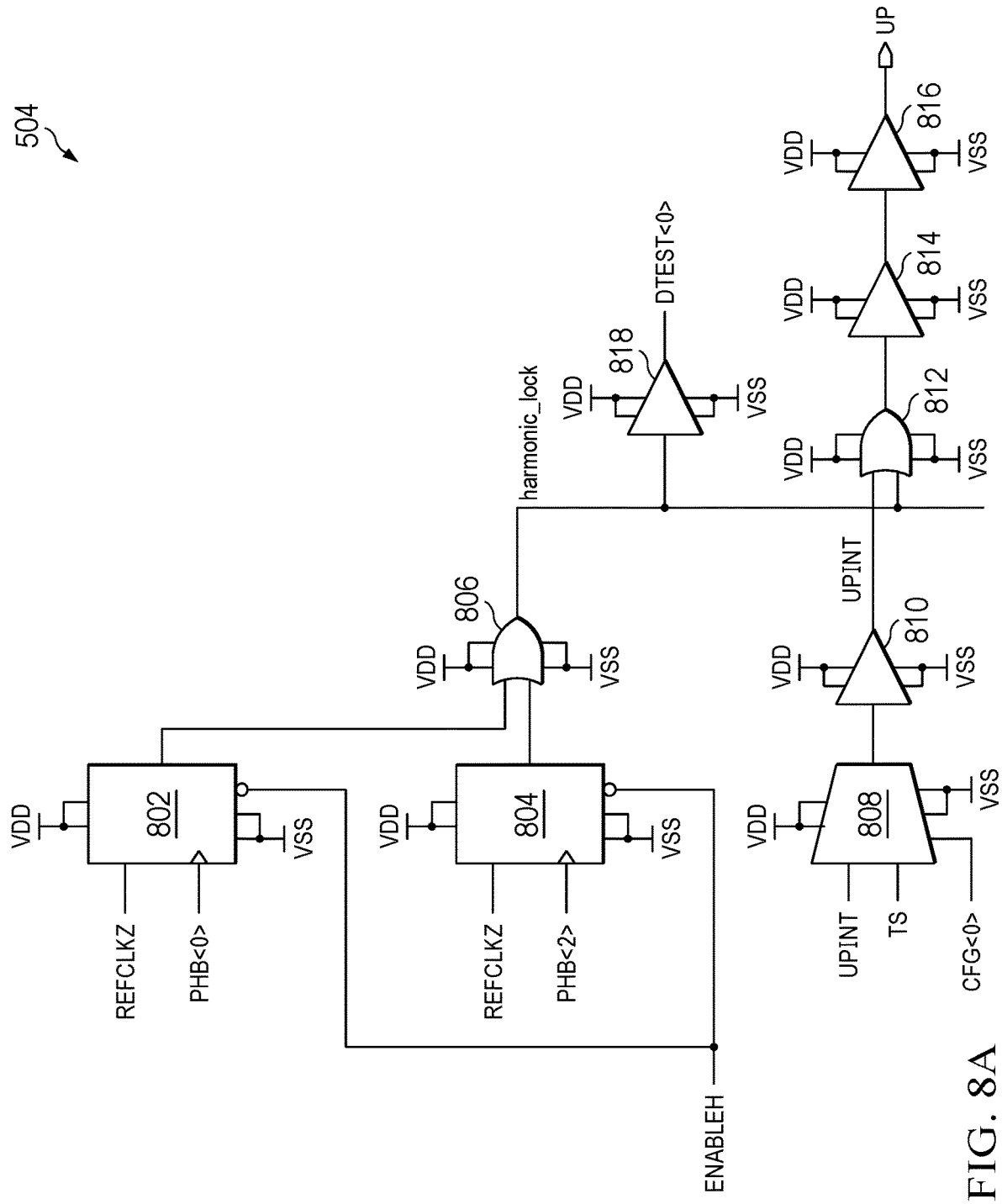
FIG. 8A illustrates an example harmonic detector and FIG. 8B illustrates an example false lock detector.
Figure 8B:
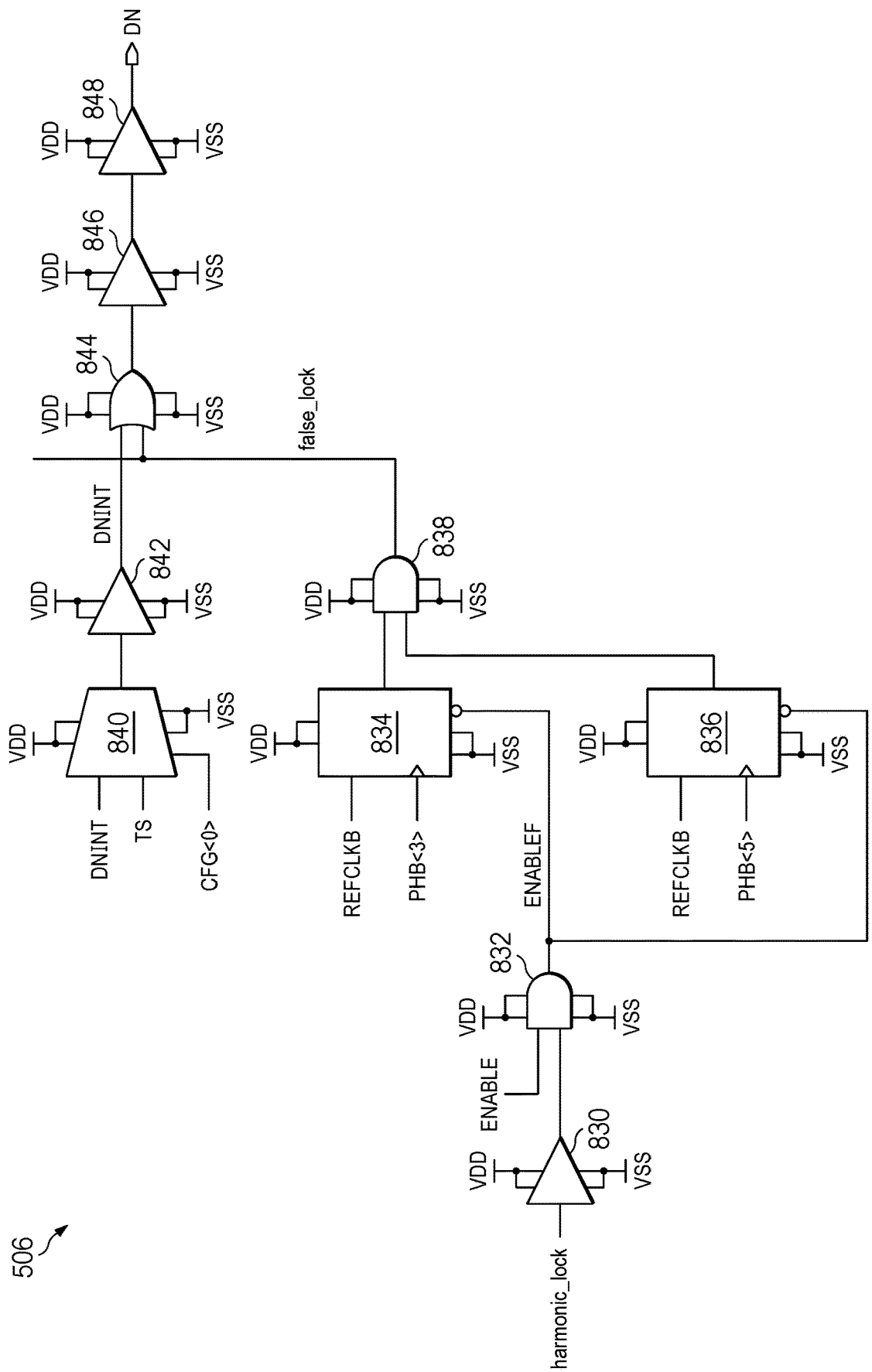

FIG. 8A illustrates an example harmonic detector 504 and FIG. 8B illustrates an example false lock detector 506. The harmonic detector 504 contains a flip flop 802, a flip flop 804, a logic gate 806, a multiplexer 808, a buffer 810, a buffer 818, a logic gate 812, a buffer 814, and a buffer 816. The flip flop 802 has a first input terminal configured to receive an inverse reference clock signal (REFCLKZ), a second input terminal configured to receive a first clock phase (PHB<0>), a control terminal configured to receive an enable signal (ENABLEH), and an output terminal coupled to a first input terminal of the logic gate 806. The flip flop 802 is configured to sample the inverse of the reference clock at the first clock phase. The flip flop 804 has a first input terminal configured to receive the inverse reference clock signal, a second input terminal configured to receive a second clock phase (PHB<2>), a control terminal configured to receive the enable signal, and an output terminal coupled to a second input terminal of the logic gate 806. The flip flop 804 is configured to sample the inverse reference clock at the second clock phase. In an example, the logic gate 806 is an OR gate. The logic gate 806 has a first input terminal coupled to the output terminal of the flip flop 802, a second input terminal coupled to the output terminal of the flip flop 804, and an output terminal coupled to an input terminal of the buffer 818 and to a second input terminal of the logic gate 812. The logic gate 806 is configured to produce a harmonic lock signal (HARMONIC_LOCK) based on a signal at the output terminal of the flip flop 802 and a signal at the output terminal of the flip flop 804. When the inverse reference clock has a value of 1 at either the first clock phase or the second clock phase, and the reference clock has a value of 0 at either the first clock phase or the second clock phase, a harmonic lock is indicated, and the harmonic lock signal will have a value of 1. When the inverse reference clock has a value of 0 at either the first clock phase or the second clock phase indicates that there is no harmonic lock, and the harmonic lock signal will have a value of 0. The buffer 818 has an input terminal coupled to the output terminal of the logic gate 806 and an output terminal. The buffer 818 propagates the harmonic lock signal. The buffer 818 is configured to produce a test signal (DTEST<0>) at the output terminal based on receiving the harmonic lock signal at the input terminal.

The multiplexer 808 has a first input terminal configured to receive the UPINT signal, a second input terminal configured to receive a test signal (TS), a control terminal configured to receive a test selector signal (CFG<0>) and an output terminal coupled to an input terminal of the buffer 810. When testing is not being performed, the multiplexer 808 will produce the UPINT signal at the output terminal. When testing is being performed, the multiplexer 808 will produce the test signal at the output terminal. The buffer 810 has an input terminal coupled to the output terminal of the multiplexer 808 and an output terminal coupled to a first input terminal of the logic gate 812. In an example, the logic gate 812 is an OR gate. The logic gate 812 has a first input terminal coupled to the output of the buffer 810, a second input terminal coupled to the output of the logic gate 806, and an output terminal coupled to an input terminal of the buffer 814. The first input terminal of the logic gate 812 is configured to receive the UPINT signal, and the second input terminal of the logic gate 812 is configured to receive the harmonic lock signal. The logic gate 812 is configured to produce a signal having a value of 1 when the UPINT signal is 1 or when the harmonic lock signal is 1. That is, when the harmonic lock signal is 1, and a harmonic lock is detected, the logic gate 812 produces a value of 1. When the harmonic lock signal is 0, and a harmonic lock is not detected, the logic gate 812 produces the value of UPINT, enabling the PD 502 to control the UP signal. The buffer 814 has an input terminal coupled to the output terminal of the logic gate 812 and an output terminal coupled to an input terminal of the buffer 816. The buffer 816 has an input terminal coupled to the output terminal of the buffer 814 and an output terminal. The buffer 816 is configured to produce the UP signal at the output terminal. When the UP signal is 1, the CL and buffer 208 increases the voltage control signal, decreasing the delay of the clock phases. The harmonic detector 504 contains only a small amount of digital logic, and is accordingly low in cost and low in power.

FIG. 8B illustrates the false lock detector 506. The false lock detector 506 includes a flip flop 834, a flip flop 836, a logic gate 838, a logic gate 830, a logic gate 832, a multiplexer 840, a buffer 842, a logic gate 844, a buffer 846, and a buffer 848. The logic gate 830 has an input terminal configured to receive the harmonic lock signal and an output terminal coupled to a second input terminal of the logic gate 832. In an example, the logic gate 830 is an inverter. In an example the logic gate 832 is an AND gate. The logic gate 832 has a first input terminal configured to receive an enable signal and a second input terminal coupled to the output terminal of the logic gate 830. The logic gate 832 has an output terminal coupled to a control terminal of the flip flop 834 and to a control terminal of the flip flop 836. The logic gate 832 is configured to produce a flip flop enable signal (ENABLEF) when the enable signal is 1 and the harmonic lock signal is 0. That is, the logic gate 832 is configure to enable the flip flop 834 and the flip flop 836 when a harmonic lock is not detected and the false lock detector is enabled. The flip flop enable signal is high when both the enable signal is high and the harmonic lock signal is low. Accordingly, when the harmonic detector 504 detects a harmonic lock, the flip flop 834 and the flip flop 836 of the false lock detector 506 are disabled. In this example, the harmonic detector 504 overrides the false lock detector 506.

The flip flop 834 has a first input terminal configured to receive the reference clock signal (REFCLKB), a second input terminal configured to receive a third clock phase (PHB<3>), a control input coupled to the output terminal of the logic gate 832, and an output terminal coupled to a first input terminal of the logic gate 838. The flip flop 834 is configured to sample the reference clock at the third clock phase. The flip flop 836 has a first input terminal configured to receive the reference clock signal, a second input terminal configured to receive a fourth clock phase (PHB<5>), a control terminal coupled to the output terminal of the logic gate 832, and an output terminal coupled to a second input terminal of the logic gate 838. The flip flop 836 is configured to sample the reference clock at the fourth clock phase. In an example, the logic gate 838 is an AND gate. The logic gate 838 has a first input terminal coupled to the output terminal of the flip flop 834, a second input terminal coupled to an output terminal of the flip flop 836, and an output terminal coupled to a second input terminal of the logic gate 844. The logic gate 838 is configured to produce a false lock signal (FALSE_LOCK) based on the output signal of the flip flop 834 and the output of the flip flop 836. The logic gate 838 produces a 1 when reference clock has a 1 value at the third clock phase and the fourth clock phase, indicating a false lock condition. The logic gate 838 produces a value of 1, indicating that a false lock is not detected, when the reference clock has a value of 0 at either the third clock phase or the fourth clock phase.

The multiplexer 840 has a first input terminal configured to receive a first down signal (DNINT), a second input terminal configured to receive a test signal (TS), a control signal configured to receive a test control signal (CFG<0>), and an output terminal coupled to an input terminal of the buffer 842. The multiplexer 840 is configured to produce the DNINT at the output terminal when the test control signal indicates that a test is not being performed. The multiplexer 840 is configured to produce the test signal when the test control signal indicates that a test is being performed. The buffer 842 has an input terminal coupled to the output terminal of the multiplexer 840 and an output terminal coupled to a first input terminal of the logic gate 844. In an example, the logic gate 844 is an OR gate. The logic gate 844 has a first input terminal coupled to the output terminal of the buffer 842, a second input terminal coupled to the output of the logic gate 838, and an output terminal coupled to the input terminal of the buffer 846. The first input terminal of the logic gate 844 is configured to receive the DNINT signal and the second input terminal of the logic gate 844 is configured to receive the false lock signal. The logic gate 844 is configured to produce a 1 when either the DNINT signal is 1 or the false lock signal is 1. That is, when the false lock signal is 1, the logic gate 844 produces a 1, and when the false lock signal is 0, the logic gate 844 produces the DNINT signal, enabling the PD 502 to control the DN signal. The buffer 846 has a first input terminal coupled to the output terminal of the logic gate 844 and an output terminal coupled to an input terminal of the buffer 848. The buffer 848 has an input terminal coupled to the output terminal of the buffer 846 and an output terminal. The buffer 848 is configured to produce a DN signal to decrease the voltage produced by the charge pump and buffer 208 to decrease the delay by the variable delay line 206 when the false lock signal is 1 or the DNINT signal is 1. The false lock detector 506 contains only a small amount of digital logic, and is accordingly low in cost and low in power.

Figure 9A:
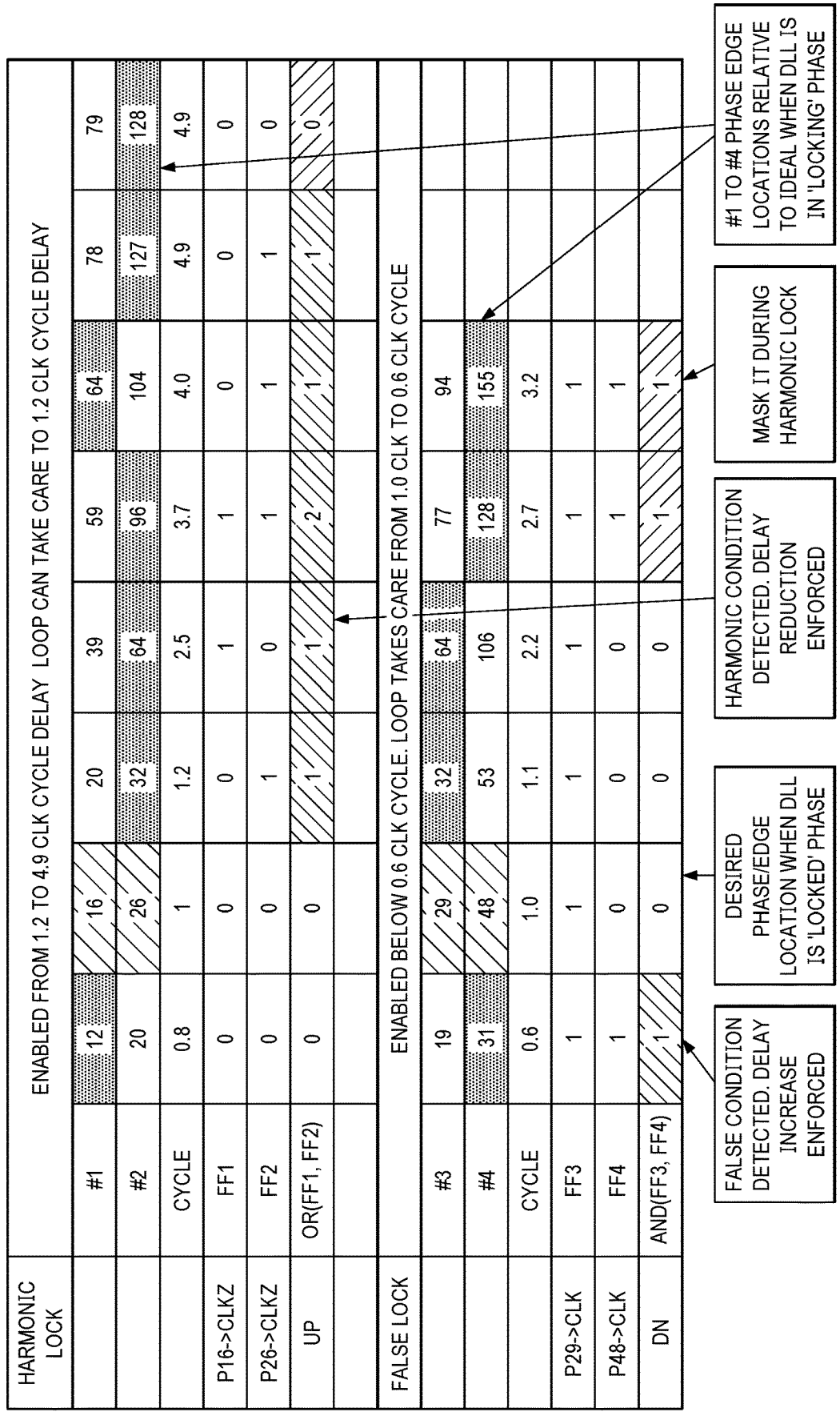

FIG. 9A illustrates a table illustrating the operation of the PFD 204 detector and FIGS. 9B-E illustrate graphs illustrating the operation of the PFD 204. FIG. 9A illustrates a table 900 showing the operation of the PFD 204. In the example illustrated in FIG. 9A, the PFD 204 detects a harmonic lock from 1.2 clock cycle delay to 4.9 clock cycle delay. In other examples with different values for the first phase, the second phase, the third phase, and the fourth phase have different clock delay ranges for harmonic lock detection. The table 900 shows the outputs of the flip flop 802, the flip flop 804, and the UP output of the harmonic detector 504 for various cycle delays. The table 900 also shows the outputs from the flip flop 834, the flip flop 836, and the DN output of the false lock detector 506 for various cycle delays. In the example illustrated in FIG. 9A, the first clock phase is 16, the second clock phase is 26, the third clock phase is 29, and the fourth clock phase is 48. However, in other examples, different values of the first clock phase, the second clock phase, the third clock phase, and the fourth clock phase are used.

FIG. 9B illustrates a graph 920 illustrating the operation of an example PFD 204 in which the cycle of the feedback clock is 0.6 the cycle of the reference clock. The graph 920 illustrates a reference clock 922, an inverse reference clock 924, and a feedback clock 926. The graph 920 also illustrates a first clock phase 928, a second clock phase 930, a third clock phase 932, and a fourth clock phase 934. When the cycle of the feedback clock is 0.6 the cycle of the reference clock, the third clock phase will be at 19 with respect to the reference clock and the fourth clock phase will be at 31 with respect to the reference clock. In this example, in the harmonic detector 504, the first flip flop 802 with produce a 0, the second flip flop 804 will produce a 0, and the UP signal will be a 0. A harmonic lock is not detected. In this example, in the false lock detector 506, the third flip flop 834 will produce a 1, the fourth flip flop 804 will produce a 1, and the DN signal will be a 1. Accordingly, a false lock is correctly detected.

When the cycle of the feedback clock is 0.8 the cycle of the reference clock, the first clock phase will fall at 12 with respect to the reference clock and the second clock phase will fall at 20 with respect to the reference clock. In this example, in the harmonic detector 504, the first flip flop 802 will produce a 0, the second flip flop 804 will produce a 0, and the UP signal will be a 0. No harmonic detection is detected.

FIG. 9C illustrates a graph 940 illustrates the operation of an example PFD 204 in which the cycle of the feedback clock is equal to the cycle of the reference clock. The graph 940 illustrates a reference clock 942, an inverse reference clock 944, and a feedback clock 946. The graph 940 also illustrates a first clock phase 948, a second clock phase 950, a third clock phase 952, and a fourth clock phase 954. The first clock phase will be 16 and the second clock phase will be 26 with respect to the reference clock. In this example, in the harmonic detector 504, the first flip flop 802 will produce a 0, the second flip flop 804 will produce a 0, and the UP signal will be a 0. No harmonic detection is correctly detected. The third clock phase will fall at 29 with respect to the reference clock and the fourth clock phase will fall at 48 with respect to the reference clock. In this example, in the false lock detector 506, the third flip flop 834 will produce a 0, the fourth flip flop 804 will produce a 0, and the DN signal will be a 0. Accordingly, a false lock is correctly not detected.

When the cycle of the cycle of the feedback clock is 1.1 the cycle of the reference clock, the third clock phase will fall at 32 with respect to the reference clock and the fourth clock phase will fall at 53 with respect to the reference clock. In this example, in the false lock detector 506, the third flip flop 834 will produce a 0, the fourth flip flop 804 will produce a 0, and the DN signal will be a 0. Accordingly, a false lock is properly not detected.

When the cycle of the feedback clock has a cycle that is 1.2 the cycle of the reference clock, the first clock phase will fall at 20 with respect to the reference clock and the second clock phase will fall at 32 with respect to the reference clock. In this example, in the harmonic detector 504, the first flip flop 802 will produce a 0, the second flip flop 804 will produce a 1, and the UP signal will be a 1. Accordingly, a harmonic lock is detected.

Figure 9D:
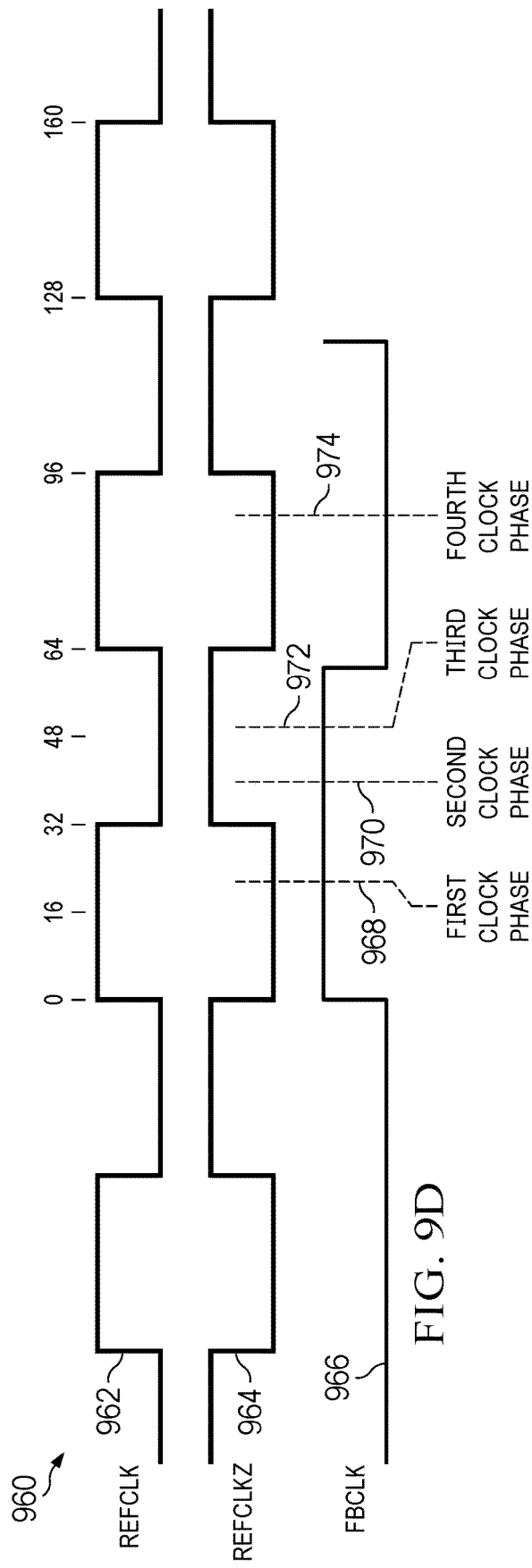

FIG. 9D illustrates a graph 960 illustrates the operation of the PFD 204 in which the cycle of the feedback clock has a cycle that is 1.8 times the cycle of the reference clock. Similar behavior is seen from a 1.2 clock cycle delay to a 2.5 clock cycle delay. The graph 960 illustrates a reference clock 962, an inverse reference clock 964, and a feedback clock 966. The graph 960 also illustrates a first clock phase 968, a second clock phase 970, a third clock phase 972, and a fourth clock phase 974. In this example, in the harmonic detector 504, the first flip flop 802 will produce a 0, the second flip flop 804 will produce a 1, and the UP signal will be a 1. A harmonic lock will be correctly detected. The detection of the harmonic lock disables the false lock detector 506. In this example, in the false lock detector 506, the third flip flop 834 would produce a 1, the fourth flip flop 804 would produce a 0, and the DN signal will be a 0. Accordingly, a false lock would not be detected.

When the cycle of the feedback clock is 2.2, the third clock phase will fall at 64 with respect to the reference clock and the fourth clock phase will fall at 106 with respect to the reference clock. In this example, in the false lock detector

506, the third flip flop 834 will produce a 0, the fourth flip flop 804 will produce a 0, and the DN signal will be a 0. Accordingly, a false lock is properly not detected.

When the cycle of the feedback clock is 2.5, the first clock phase will fall at 39 with respect to the reference clock and the second clock phase will fall at 64 with respect to the reference clock. In this example, in the harmonic detector 504, the first flip flop 802 will produce a 1, the second flip flop 804 will produce a 0, and the UP signal will be a 1. Accordingly, a harmonic lock is detected.

When the cycle of the feedback clock is 2.7, the third clock phase will fall at 77 with respect to the reference clock and the fourth clock phase will fall at 128 with respect to the reference clock. In this example, in the false lock detector 506, the third flip flop 834 would produce a 1, the fourth flip flop 804 would produce a 0, and the DN signal will be a 1. Accordingly, the false lock detector 506 would incorrectly detect a false lock. However, when a harmonic lock is detected, the false lock detector 506 is deactivated, preventing the incorrect detection of a false lock.

When the cycle of the feedback clock is 3.2, the third clock phase will fall at 94 with respect to the reference clock and the fourth clock phase will fall at 155 with respect to the reference clock. In this example, in the false lock detector 506, the third flip flop 834 would produce a 1, the fourth flip flop 804 would produce a 0, and the DN signal would be a 1. Accordingly, the false lock detector 506 would incorrectly detect a false lock. However, when a harmonic lock is detected, the false lock detector 506 is deactivated, preventing the incorrect detection of a false lock.

Figure 9E:
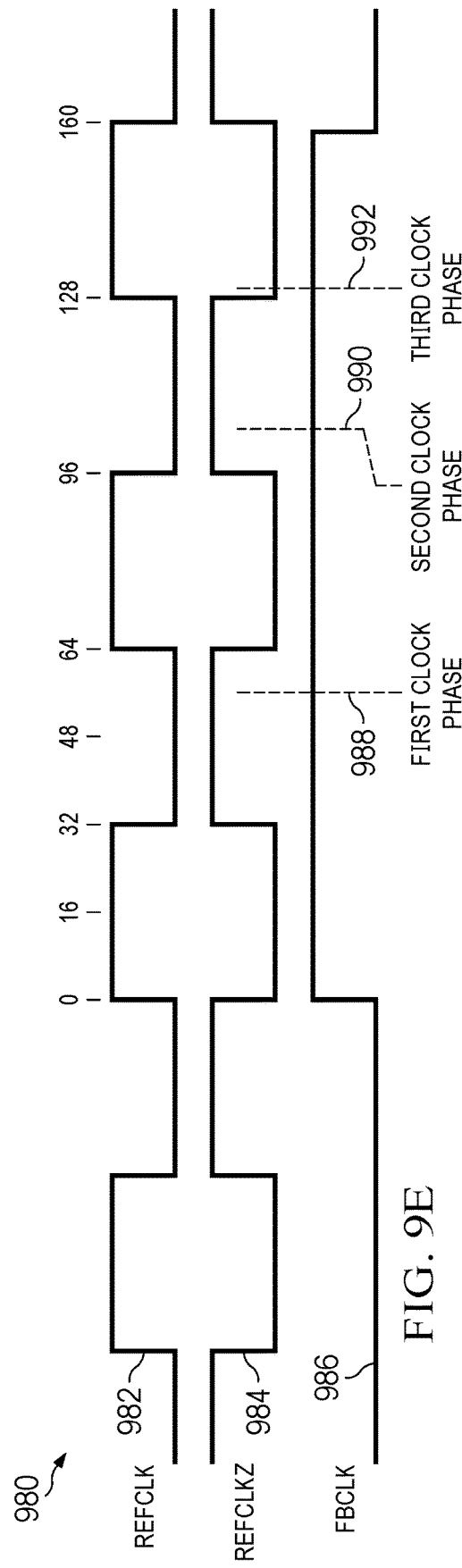

FIG. 9E illustrates a graph 980 illustrates the PFD 204 in which the cycle of the feedback clock has a cycle that is 3.7 times the cycle of the reference clock. The graph 980 illustrates a reference clock 982, an inverse reference clock 984, and a feedback clock 986. The graph 960 also illustrates a first clock phase 988, a second clock phase 990, a third clock phase 992, and a fourth clock phase is not pictured. When the cycle of the feedback clock is 3.7, the first clock phase will fall at 59 with respect to the reference clock and the second clock phase will fall at 96 with respect to the reference clock. In this example, in the harmonic detector 504, the first flip flop 802 will produce a 1, the second flip flop 804 will produce a 1, and the UP signal will be a 1. Accordingly, a harmonic lock is detected.

When the cycle of the feedback clock is 4.0, the first clock phase will fall at 64 with respect to the reference clock and the second clock phase will fall at 104 with respect to the reference clock. In this example, in the harmonic detector 504, the first flip flop 802 will produce a 0, the second flip flop 804 will produce a 1, and the UP signal will be a 1. Accordingly, a harmonic lock is correctly detected.

In an example where the cycle of the feedback clock is 4.9, the first clock phase will fall at 78 with respect to the reference clock and the second clock phase will fall at 127 with respect to the reference clock. In this example, in the harmonic detector 504, the first flip flop 802 will produce a 0, the second flip flop 804 will produce a 1, and the UP signal will be a 1. Accordingly, a harmonic lock is properly detected.

In another example where the cycle of the feedback clock is 4.9, the first clock phase will fall at 79 with respect to the reference clock and the second clock phase will fall at 128 with respect to the reference clock. In this example, in the harmonic detector 504, the first flip flop 802 will produce a 0, the second flip flop 804 will produce a 0, and the UP signal will be a 1. Accordingly, a harmonic lock is incorrectly not detected.

Figure 10:
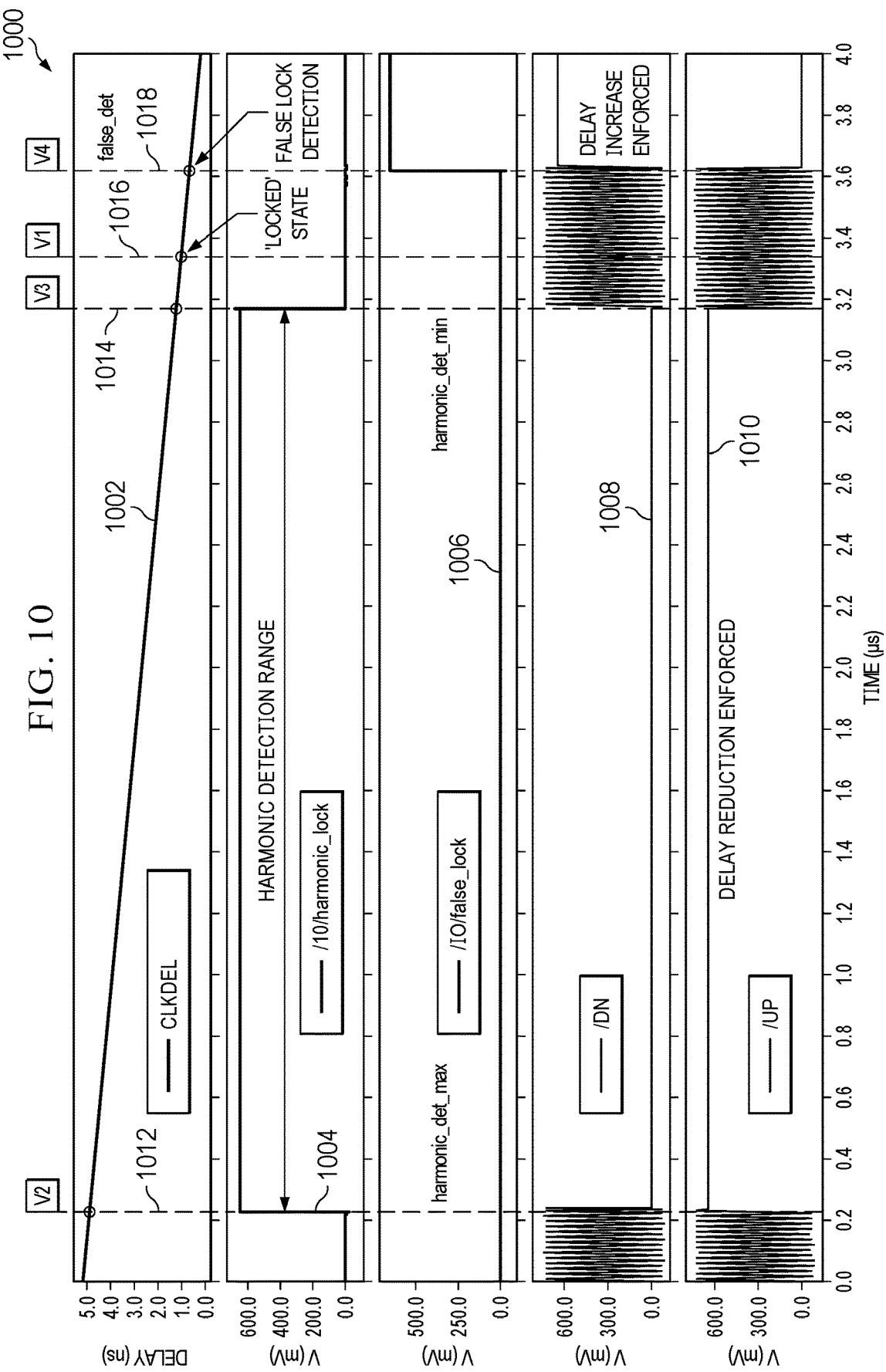
FIG. 10 illustrates the operation of an example PFD with a harmonic detector and a false lock detector.

FIG. 10 illustrates a graph 1000 depicting the operation of PFD 204 in the time domain. The graph 1000 illustrates a clock delay 1002, a harmonic lock signal 1004, a false lock signal 1006, a DN signal 1008, and an UP signal 1010. Before time 1012, the harmonic detector 504 and the false lock detector 506 are turned off. The PD 502 controls operation of the PFD 204. At time 1012, the harmonic detector 504 is turned on. The harmonic lock signal 1004 becomes a 1, and the UP signal 1010 becomes a 1. The false lock signal 1006 is a 0, and the DN signal 1008 is a 0. At time 1014, the harmonic lock has been corrected. The harmonic lock signal 1004 becomes a 0, and the false lock signal 1006 remains a 0. The PD 502 controls the PFD 204. At time 1016, the PFD 204 continues to operate in a locked state, with the PD 502 controlling the DLL lock. At time 1018, a false lock is detected. The false lock signal 1006 becomes a 1, and the DN signal 1008 becomes a 1. The harmonic lock signal 1004 and the UP signal 1010 remain at 0.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A circuit comprising:
    a phase detector configured to produce a first up signal and a first down signal based on a difference between a reference clock and a feedback clock;
    a harmonic detector coupled to the phase detector, the harmonic detector configured to produce a second up signal based on the first up signal and whether the harmonic detector detects a harmonic lock between the reference clock and the feedback clock based on a first clock phase and a second clock phase; and
    a false lock detector coupled to the phase detector and to the harmonic detector, the false lock detector configured to produce a second down signal based on the first down signal and whether the false lock detector detects a false lock between the reference clock and the feedback clock based on a third clock phase and a fourth clock phase.

2. The circuit of claim 1, wherein the harmonic detector comprises:
    a first flip flop having a first flip flop input, a second flip flop input, and a first flip flop output, the first flip flop input configured to receive an inverse reference clock and the second flip flop input configured to receive the first clock phase;
    a second flip flop having a third flip flop input, a fourth flip flop input, and a second flip flop output, the third flip flop input configured to receive the inverse reference clock and the fourth flip flop input configured to receive the second clock phase;
    a first OR gate having a first OR input, a second OR input, and a first OR output, the first OR input coupled to the first flip flop output and the second OR input coupled to the second flip flop output; and a second OR gate having a third OR input, a fourth OR input, and a second OR output, the third OR input coupled to the first OR output, the fourth OR input configured to receive the first up signal, and the second OR gate configured to produce the second up signal at the second OR output.

3. The circuit of claim 1, wherein the false lock detector comprises:
a third flip flop having a fifth flip flop input, a sixth flip flop input, and a third flip flop output, the fifth flip flop input configured to receive the reference clock and the sixth flip flop input configured to receive the third clock phase;
a fourth flip flop having a seventh flip flop input, an eighth flip flop input, and a fourth flip flop output, the seventh flip flop input configured to receive the reference clock and the eighth flip flop input configured to receive the fourth clock phase;
an AND gate having a first AND input, a second AND input, and an AND output, the first AND input coupled to the third flip flop output and the second AND input coupled to the fourth flip flop output; and
a third OR gate having a fifth OR input, a sixth OR input, and a third OR output, the fifth OR input coupled to the AND output, the sixth OR input configured to receive the first down signal, and the third OR gate configured to produce the second up signal at the third OR output.

4. The circuit of claim 1, further comprising:
a charge pump coupled to the harmonic detector and to the false lock detector, the charge pump configured to produce a voltage control signal based on the second up signal and the second down signal; and
a variable delay line coupled to the charge pump, to the phase detector, to the harmonic detector, and to the false lock detector, the variable delay line configured to produce the feedback clock and clock phases based on the voltage control signal, the clock phases comprising the first clock phase, the second clock phase, the third clock phase, and the fourth clock phase.

5. The circuit of claim 1, wherein the harmonic detector is configured to disable the false lock detector when the harmonic detector detects a harmonic lock.

6. A circuit comprising:
a first flip flop having a first flip flop input, a second flip flop input, and a first flip flop output;
a second flip flop having a third flip flop input, a fourth flip flop input, and a second flip flop output;
a first logic gate having a first logic input, a second logic input, and a first logic output, the first logic input coupled to the first flip flop output and the second logic input coupled to the second flip flop output;
a third flip flop having a fifth flip flop input, a sixth flip flop input, and a third flip flop output, the fifth flip flop input coupled to an inverse of the first flip flop input;
a fourth flip flop having a seventh flip flop input, an eighth flip flop input, and a fourth flip flop output, the seventh flip flop input coupled to an inverse of the third flip flop input; and
a second logic gate having a third logic input, a fourth logic input, and a second logic output, the third logic input coupled to the third flip flop output and the fourth logic input coupled to the fourth flip flop output.

7. The circuit of claim 6, further comprising:
a third logic gate having a fifth logic input, a sixth logic input, and a third logic output, the fifth logic input coupled to the first logic output, the sixth logic input configured to receive a first up signal at the sixth logic input, and the third logic gate configured to produce a second up signal at the third logic output; and
a fourth logic gate having a seventh logic input, an eighth logic input, and a fourth logic output, the seventh logic input coupled to the second logic output, the eighth logic input configured to receive a first down signal, and the fourth logic gate configured to produce a second down signal at the fourth logic output.

8. The circuit of claim 7, wherein the third logic gate is an OR gate and the fourth logic gate is an OR gate.

9. The circuit of claim 7, further comprising a phase detector coupled to the sixth logic input and to the eighth logic input.

10. The circuit of claim 7, further comprising a charge pump coupled to the third logic output and the fourth logic output.

11. The circuit of claim 6, further comprising a variable delay line coupled to the second flip flop input, to the fourth flip flop input, to the sixth flip flop input, and to the eighth flip flop input.

12. The circuit of claim 6, wherein the first logic gate is an OR gate and the second logic gate is an AND gate.

13. The circuit of claim 6, wherein the first flip flop input is configured to receive an inverse reference clock, the second flip flop input is configured to receive a first clock phase, the third flip flop input is configured to receive the inverse reference clock, the fourth flip flop input is configured to receive a second clock phase, the fifth flip flop input is configured to receive a reference clock, the sixth flip flop input is configured to receive a third phase, the seventh flip flop input is configured to receive the reference clock, and the eighth flip flop input is configured to receive a fourth clock phase.

14. The circuit of claim 6, further comprising an inverter having an inverter input and an inverter output, the inverter input coupled to the first logic output and the inverter output coupled to a first control terminal of the third flip flop and to a second control terminal of the fourth flip flop.

15. A system comprising:
a data path; and
a delay-locked loop (DLL) coupled to the data path, the DLL comprising:
a phase frequency detector (PFD) comprising:
a phase detector configured to produce an up signal and a first down signal based on a difference between a reference clock and a feedback clock; and
a false lock detector coupled to the phase detector, the false lock detector configured to produce a second down signal by detecting a false lock between the reference clock and the feedback clock based on the reference clock, a first clock phase, and a second clock phase;
a charge pump coupled to the PFD, the charge pump configured to produce a voltage control signal; and
a variable delay line coupled to the PFD and to the charge pump, wherein the variable delay line is configured to, based on the voltage control signal, produce clock phases comprising the first clock phase and the second clock phase.

16. The system of claim 15, wherein the up signal is a first up signal, and the PFD further comprises a harmonic detector coupled to the phase detector, the harmonic detector configured to produce a second up signal by detecting a harmonic lock between the reference clock and the feedback clock based on the reference clock, a third clock phase of the clock phases, and a fourth clock phase of the clock phases.

17. The system of claim 16, wherein the charge pump is configured to produce the voltage control signal based on the second up signal and the second down signal.

18. The system of claim 15, wherein the system comprises a controller comprising the data path and the DLL, and the controller is adapted to be coupled to a spatial light modulator (SLM).

19. The system of claim 15, wherein the data path is configured to:
receive input data;
receive, from the DLL, the clock phases; and
delay the input data based on the clock phases to produce output data.

20. The system of claim 15, wherein the system is configured to:
operate in open loop responsive to powering up the system; and
transition from operating in open loop to operating in closed loop responsive to the PFD powering up and becoming stable.

* * * * *